United States Patent
Sugimoto et al.

(10) Patent No.: US 7,418,970 B2
(45) Date of Patent: Sep. 2, 2008

(54) SUBSTRATE PROCESSING APPARATUS FOR DRYING SUBSTRATE

(75) Inventors: Hiroaki Sugimoto, Kyoto (JP); Seiichiro Okuda, Kyoto (JP); Akio Hashizume, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 612 days.

(21) Appl. No.: 10/740,711

(22) Filed: Dec. 18, 2003

(65) Prior Publication Data

US 2004/0163683 A1   Aug. 26, 2004

(30) Foreign Application Priority Data

Dec. 25, 2002   (JP) .............................. 2002-374740

(51) Int. Cl.
   *B08B 3/00*   (2006.01)
(52) U.S. Cl. ................. 134/105; 134/902; 134/200; 134/1.2
(58) Field of Classification Search ............... 134/56 R, 134/105
   See application file for complete search history.

(56) References Cited

U.S. PATENT DOCUMENTS

| | | | | |
|---|---|---|---|---|
| 6,403,924 | B1 * | 6/2002 | Hayashi | 219/390 |
| 6,550,988 | B2 * | 4/2003 | Sugimoto et al. | 396/564 |
| 6,863,741 | B2 * | 3/2005 | Orii et al. | 134/30 |
| 7,000,621 | B1 * | 2/2006 | Verhaverbeke | 134/64 R |
| 2002/0051644 | A1 * | 5/2002 | Sugimoto et al. | 396/564 |
| 2003/0066797 | A1 * | 4/2003 | Sasaki | 210/511 |
| 2004/0238008 | A1 * | 12/2004 | Savas et al. | 134/21 |

FOREIGN PATENT DOCUMENTS

| | | |
|---|---|---|
| JP | 05-243205 | 9/1993 |
| JP | 07-283126 | 10/1995 |
| JP | 08-064514 | 3/1996 |
| JP | 2001-023946 | 1/2001 |

OTHER PUBLICATIONS

English translation of Abstract for Japanese application laid-open No. 08-064514.
English translation of Abstract for Japanese application laid-open No. 05-243205.
English translation of Abstract for Japanese application laid-open No. 2001-023946.
English translation of Abstract for Japanese application laid-open No. 07-283126.
English translation of Japanese Office Action dated Aug. 1, 2006 issued in connection with corresponding Japanese application No. 2002-374740.

* cited by examiner

*Primary Examiner*—Michael Barr
*Assistant Examiner*—Jason P Riggleman
(74) *Attorney, Agent, or Firm*—Ostrolenk, Faber, Gerb & Soffen, LLP

(57) ABSTRACT

A substrate processing apparatus includes a container in which a heating plate, a discharge nozzle for discharging a vapor of organic solvent, and a discharge nozzle for supplying a process gas and a cooling gas are provided. A pump in communication with an exhaust outlet of the container exhausts an atmosphere from the container to reduce pressure in the container. Therefore, the substrate processing apparatus is capable of performing (1) the process of drying a substrate in a reduced-pressure atmosphere by the use of the vapor of organic solvent, and (2) the process of drying the substrate in the reduced-pressure atmosphere by heating, to thereby efficiently dry the substrate.

1 Claim, 15 Drawing Sheets

SUBSTRATE PROCESSING APPARATUS FOR DRYING SUBSTRATE

BACKGROUND OF THE INVENTION

1. Field of the Invention

The present invention relates to a drying apparatus for drying substrates including a semiconductor substrate, a glass substrate for a liquid crystal display device, a glass substrate for a photomask, a substrate for an optical disc, and the like after a processing solution (or a rinsing solution) such as deionized water is used to rinse the substrates and thereafter is spun off the substrates by rotational motion, and to a substrate processing apparatus including the drying apparatus.

2. Description of the Background Art

A substrate processing apparatus performs successive surface preparation processes including a chemical process using various liquid chemicals, a rinsing process using a rinsing solution such as deionized water, and the like. After the final rinse using deionized water, a drying process is performed as the final process. One of the substrate drying processes conventionally known in the art is a spin dry process for rotating a substrate at high speeds to spin off water from the surface of the substrate by centrifugal force in a single-wafer type substrate processing apparatus for processing substrates one by one.

For improvement in drying efficiency, a drying technique in which a vapor of material which reduces the surface tension of water adhering to a substrate is brought into contact with the substrate prior to the spin dry process is disclosed in Japanese Patent Application Laid-Open No. 05-243205 (1993) and Japanese Patent Application Laid-Open No. 2001-023946. Another drying technique in which an atmosphere in which a substrate is placed during the spin dry process is adjusted to a pressure lower than atmospheric pressure is disclosed in Japanese Patent Application Laid-Open No. 07-283126 (1995).

However, as patterns formed on a substrate become finer and more complicated, it is becoming difficult to reliably dry the substrate by removing water or moisture entering the inside of a microstructure, e.g. a space between lines of the patterns, the inside of a hole and the inside of a resist film, by the use of the disclosed drying techniques.

SUMMARY OF THE INVENTION

The present invention is intended for a substrate processing apparatus for drying a substrate after a rinsing solution adhering to a surface of the substrate is spun off by rotating the substrate.

According to the present invention, the substrate processing apparatus comprises: a container for receiving a substrate; a holding element provided in the container for holding the substrate in a gaseous atmosphere; an organic solvent discharge element for discharging an organic solvent into the container to create an atmosphere containing the organic solvent near the substrate held by the holding element; a pressure reduction element for exhausting the container to create a reduced-pressure atmosphere in the container; and a controller for controlling the organic solvent discharge element and the pressure reduction element to maintain the interior of the container at substantially the same pressure for a fixed length of time after the organic solvent is discharged into the container containing the reduced-pressure atmosphere.

The interior of the container is held at substantially the same pressure for the fixed length of time after the discharge of the organic solvent. This improves the efficiency of replacement of deionized water entering a space between lines and the inside of holes formed on the substrate and deionized water in films formed on the substrate with the organic solvent. The substrate processing apparatus, therefore, is capable of drying the substrate efficiently.

According to another aspect of the present invention, the substrate processing apparatus comprises: a first container for receiving a substrate; a first holding element provided in the first container for holding the substrate in a gaseous atmosphere; a heating element provided in the first container for heating the substrate held by the first holding element; a first process gas discharge element for discharging a process gas into the first container; and a first pressure reduction element for reducing pressure in the first container.

The substrate processing apparatus reduces the pressure in the first container while discharging the process gas into the first container, to heat the substrate held by the first holding element in a reduced-pressure atmosphere, thereby drying the substrate. The substrate processing apparatus, therefore, prevents oxidation of the substrate during the heating, to dry the substrate efficiently.

According to still another aspect of the present invention, the substrate processing apparatus comprises: a container for receiving a substrate; a holding element provided in the container for holding the substrate in a gaseous atmosphere; an organic solvent discharge element for discharging an organic solvent into the container to create an atmosphere containing the organic solvent near the substrate held by the holding element; a heating element provided in the container for heating the substrate held by the holding element; a process gas discharge element for discharging a process gas into the container; and a pressure reduction element for reducing pressure in the container.

The substrate processing apparatus is capable of activating (1) the process of drying the substrate by creating a reduced-pressure atmosphere in the container and by creating the atmosphere containing the organic solvent near the substrate, and (2) the process of drying the substrate by creating a process gas atmosphere to reduce the pressure in the container and by heating the substrate held by the holding element in the container in which the pressure is reduced. This allows a selection between the drying processes depending on the types of films formed on the substrate.

It is therefore an object of the present invention to provide a substrate processing apparatus capable of reliably drying a substrate by removing a rinsing solution entering the inside of a microstructure formed on the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will now be described in detail with reference to the drawings.

1. First Preferred Embodiment

Figure 1:
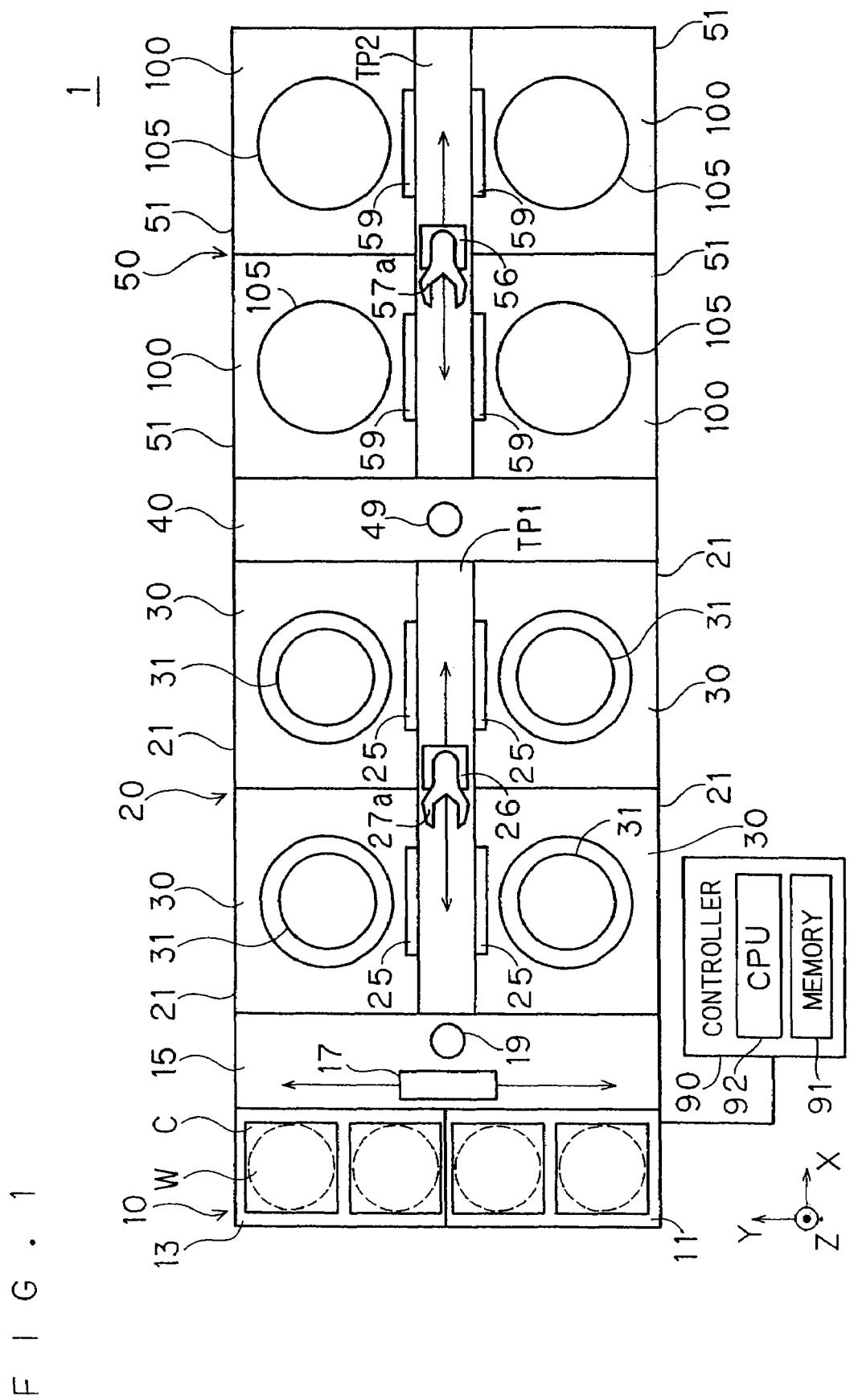
FIG. 1 is a schematic plan view showing the overall construction of a substrate processing apparatus according to a first preferred embodiment of the present invention.

FIG. 1 is a schematic plan view showing the overall construction of a substrate processing apparatus 1 according to a first preferred embodiment of the present invention. The substrate processing apparatus 1 is an apparatus for removing a polymer residue which is part of a resist film spattered, deposited on the bottom and side walls of a wiring pattern, and hardened in a dry etching process using the resist film as a mask. As shown in FIG. 1, the substrate processing apparatus 1 principally comprises a removal part 20 including a plurality of removal units 30, a drying part 50 including a plurality of drying units 100, and an indexer 10. For the sake of definiteness of directions relative to each other, FIG. 1 and its subsequent figures include an XYZ rectangular coordinate system, as required, which defines the direction of the Z axis as the vertical direction and the X-Y plane as the horizontal plane.

The indexer 10 includes a loading part 11 on which a carrier (or a cassette) C containing a plurality of unprocessed substrates (or wafers) W is placed, an unloading part 13 on which a carrier C containing a plurality of processed substrates W is placed, and a transfer part 15.

The loading part 11 includes a holding table onto which a transport mechanism, e.g. an AGV (Automatic Guided Vehicle), external to the apparatus transports two carriers C. Each of the carriers C holds therein, for example, 25 substrates W in the horizontal position arranged vertically in tiers in spaced apart relation. The unloading part 13 also includes a holding table. Two carriers C are placed on the holding table and are transported out of the apparatus by the transport mechanism external to the apparatus 1.

The transfer part 15 includes a loading/unloading mechanism 17 moving in a direction (Y direction) in which the carriers C in the loading part 11 and the unloading part 13 are arranged and for loading and unloading substrates W into and out of the carriers C, and a transfer table 19. The loading/unloading mechanism 17 includes a loading/unloading arm not shown, and is capable of rotating about a vertical axis, moving up and down in the vertical direction, and moving the loading/unloading arm back and forth in addition to moving horizontally. Thus, the loading/unloading mechanism 17 loads and unloads the substrates W into and out of the carriers C, and transfers and receives the substrates W to and from the transfer table 19.

As shown in FIG. 1, the removal part 20 includes the plurality of removal units 30 for principally removing the polymer deposited on substrates, and a transport unit 26 for transferring the substrates W between transfer tables 19, 49 and the removal units 30.

The removal units 30 are spaced in two lines arranged in the Y direction, each of the lines being formed by two removal units 30 arranged in a direction (X direction) perpendicular to the Y direction. Each of the removal units 30 is a unit for discharging toward a substrate W a removal solution (e.g., a liquid containing an organic alkaline solution, a liquid containing an inorganic acid, and a liquid containing an ammonium fluoride based material) which selectively dissolves only the polymer residue deposited on the substrate W while rotating the substrate W held by a rotary holding part 31 provided in a processing chamber 21, thereby to clean off only the polymer residue deposited on the substrate W. The substrate W is also rinsed with deionized water and spin-dried in each of the removal units 30.

The processing chamber 21 has an enclosure structure which closes off communication between the interior and exterior of the processing chamber 21, to prevent an atmosphere in the processing chamber 21 from leaking out to a transport passage TP1, the indexer 10, and an interface 40. A wall surface of the processing chamber 21 which faces the transport passage TP1 is provided with a shutter 25. The shutter 25 is opened by an opening/closing mechanism not shown when the transport unit 26 transports the substrate W into or out of the rotary holding part 31 in the processing chamber 21, and is closed at other times. The atmosphere in the processing chamber 21 is exhausted to an exhaust duct outside the apparatus 1 by an exhaust mechanism not shown. This prevents the atmosphere containing a mist or vapor of processing solution generated by the polymer removal process from leaking out of the processing chamber 21 to the transport passage TP1.

The transport unit 26 is a transport robot traveling in the longitudinal direction of the transport passage TP1 (in the X direction). The transport unit 26 includes an arm 27a extendable/retractable in the longitudinal direction of the arm 27a by an extension/retraction mechanism not shown. The arm 27a is also pivotable about a pivot axis substantially parallel to the Z axis by a pivot mechanism not shown. Thus, the transport unit 26 pivots and extends/retracts the arm 27a to transfer and receive the substrate W to and from each of the four removal units 30 and to transfer and receive the substrate W to and from the transfer tables 19 and 49.

The interface 40 is provided so as to be sandwiched between the removal part 20 and the drying part 50, and includes the transfer table 49 for placing the substrate W thereon.

As illustrated in FIG. 1, the drying part 50 is provided adjacent to the interface 40, and includes the four drying units 100 receiving the substrate W therein for performing a drying process, and a transport unit 56 for transferring and receiving the substrate W to and from the transfer table 49 and for transferring and receiving the substrate W to and from each of the four drying units 100.

The drying units 100 are spaced in two lines arranged in the Y direction, each of the lines being formed by two drying units 100 arranged in the direction (X direction) perpendicular to the Y direction. The transport unit 56 is in a transport passage TP2 lying between the two lines of the drying units 100.

The transport unit 56 is a transport robot traveling in the longitudinal direction of the transport passage TP2 (in the X direction). The transport unit 56 includes an arm 57a extendable/retractable in the longitudinal direction of the arm 57a by an extension/retraction mechanism not shown. The arm 57a is also pivotable about a pivot axis substantially parallel to the Z axis by a pivot mechanism not shown. Thus, the transport unit 56 pivots and extends/retracts the arm 57a to transfer and receive the substrate W to and from each of the four drying units 100 and to transfer and receive the substrate W to and from the transfer table 49. The details of the drying units 100 will be described later.

A controller 90 includes a memory 91 for storing a program, variables and the like, and a CPU 92 for effecting control in accordance with the program stored in the memory 91. In accordance with the program stored in the memory 91, the CPU 92 controls the rotation of the rotary holding part 31, the driving of the transport units 26 and 56, the opening and closing of the shutters 25 and 59, the opening and closing of valves 135, 145, 146, 155 and 165 to be described later, the output of a heating plate 112, and the like in predetermined timed relation.

Figure 2:
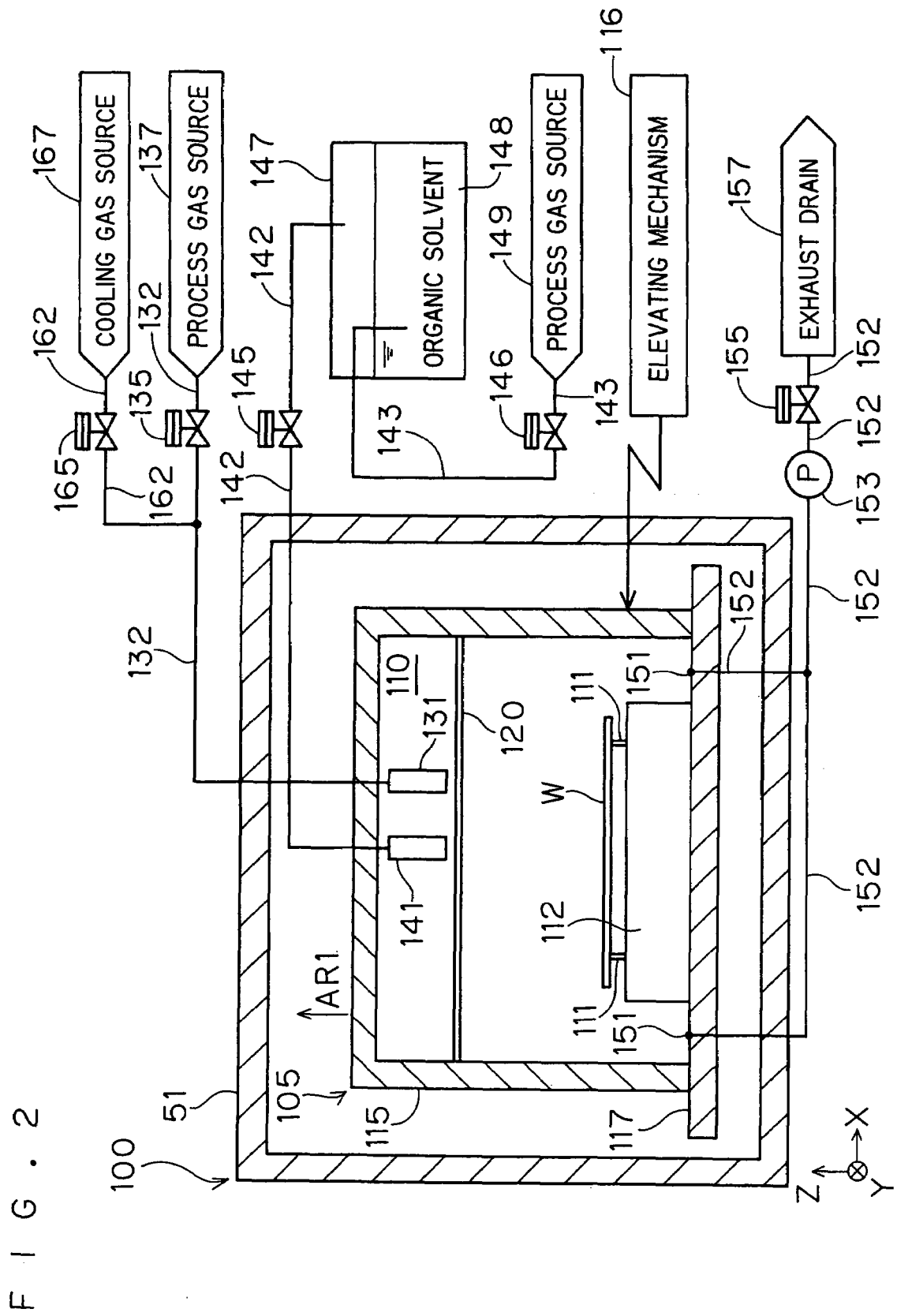
FIG. 2 is a schematic front view of a drying unit according to the first preferred embodiment.

FIG. 2 is a schematic front view of each of the drying units 100 according to the first preferred embodiment. The drying unit 100 is capable of exclusively (or selectively) activating (1) an organic solvent drying process for supplying a vapor of organic solvent to near the substrate W in a reduced-pressure atmosphere to remove water or moisture adhering to the substrate W, thereby drying the substrate W, and (2) a heating drying process for heating the substrate W in a reduced-pressure atmosphere to remove water or moisture adhering to the substrate W, thereby drying the substrate W.

As illustrated in FIG. 2, the drying unit 100 principally comprises: a processing chamber 51; a container 105 provided inside the processing chamber 51 for performing a drying process; a pump 153 for exhausting the atmosphere in the interior 110 (referred to hereinafter as a "container interior 110") of the container 105 to the outside to create a reduced-pressure atmosphere; a discharge nozzle 141 provided inside the container 105 for discharging a vapor of organic solvent toward the substrate W; and the heating plate 112 provided inside the container 105 for heating the substrate W.

The processing chamber 51 has an enclosure structure for blocking the atmosphere in the processing chamber 51 from flowing outwardly. That is, the atmosphere in the processing chamber 51 is prevented from leaking out to the transport passage TP2 and the interface 40. A wall surface of the processing chamber 51 which faces the transport passage TP2 is provided with a shutter 59, as shown in FIG. 1. The shutter 59 is opened by an opening/closing mechanism not shown when the transport unit 56 transports the substrate W into or out of the processing chamber 51, and is closed at other times.

The atmosphere in the processing chamber 51 is exhausted to an exhaust duct outside the apparatus 1 by an exhaust mechanism not shown. This prevents the atmosphere containing a mist or vapor of processing solution, if flowing out of the container 105 into the processing chamber 51, from leaking out to the transport passage TP2.

The container 105 is provided inside the processing chamber 51, and performs the drying process therein. As shown in FIG. 2, the container 105 includes an upper cover 115 and a base part 117. The upper cover 115 is a substantially cylindrical member with an opening in its bottom. The upper cover 115 is connected to an elevating mechanism 116, and is movable up and down, the lowermost position of the upper cover 115 being such a position that the opening is substantially level with the upper surface of the base part 117.

An enclosure mechanism not shown is provided in a portion of contact between the base part 117 and the upper cover 115. This closes off communication between the container interior 110 surrounded by the inner surfaces of the upper cover 115 and the base part 117 and the interior of the processing chamber 51. Therefore, the elevating mechanism 116 moves the upper cover 115 downwardly to the lowermost position so that the enclosure mechanism encloses the container interior 110, and the pump 153 to be described later exhausts the atmosphere in the container interior 110 to the outside to create a reduced-pressure atmosphere in the container interior 110.

The heating plate 112 is a substantially cylindrical member fixed on the base part 117, and has a heat source such as an electrically heated wire provided therein. A plurality of (specifically at least three) support pins 111 are mounted upright on the upper surface of the heating plate 112. The plurality of support pins 111 support the substrate W to hold the substrate W stationary in a substantially horizontal position in the container interior 110. The plurality of support pins 111 are cooperatively moved up and down by an elevating mechanism not shown so that the upper ends of the respective support pins 111 are at substantially the same vertical position. Therefore, the upper cover 115 is moved upwardly, with the above-mentioned shutter 59 (See FIG. 1) open, and the support pins 111 are moved upwardly to raise the substrate W to a transfer position, thereby to allow the substrate W to be transferred between the heating plate 112 and the transport unit 56 (See FIG. 4).

The support pins 111 are lowered when the heating plate 112 heats the substrate W. This brings the bottom surface of the substrate W into proximity to the upper surface of the heating plate 112, to allow the heat energy of the heating plate 112 to transfer to the substrate W, thereby heating the substrate W. Although the substrate W is shown in FIG. 2 as brought into proximity to the upper surface of the heating plate 112, the bottom surface of the substrate W may be brought into contact with the upper surface of the heating plate 112.

The discharge nozzle 141 for discharging a vapor of organic solvent toward the substrate W is provided near the axis of the upper cover 115 having the substantially cylindrical shape and near the inner upper portion of the upper cover 115. As shown in FIG. 2, the discharge nozzle 141 is in communication with an upper space of a reservoir 147 with an organic solvent 148 stored therein through a pipe 142 and a valve 145. A pipe 143 has an end immersed in the organic solvent 148 stored in the reservoir 147, and is in communication with a process gas source 149 through a valve 146, as shown in FIG. 2.

This supplies bubbles of a process gas to the organic solvent 148 to allow the process gas to bubble the organic solvent 148. When the valves 146 and 145 are open, a vapor of the organic solvent 148 is mixed in the process gas by the bubbling. Then, the vapor of organic solvent passing through the pipe 142 is discharged from the discharge nozzle 141 toward the substrate W held by the support pins 111.

In this preferred embodiment, isopropyl alcohol (IPA) is used as the organic solvent. However, vapors of other organic solvents having a lower surface tension and a lower latent heat of vaporization than deionized water may be used, such as low molecular weight alcohol, silicone, and hydro-fluoro-ether (HFE) which is a fluorine-based solvent.

Although nitrogen gas is used as the process gas in this preferred embodiment, helium gas or argon gas may be used if the gas is chemically stable (an inert gas).

When IPA having combustibility is used as the organic solvent, it is necessary to prevent the simultaneous execution of the heating process using the heating plate 112 and the process of discharging the organic solvent from the discharge nozzle 141. To this end, the memory 91 according to the first preferred embodiment has stored therein a program for selectively effecting output control for controlling an output value from the heating plate 112 to not less than zero and opening control for opening the valve 145. The execution of the program by the CPU 92 causes the selective activation of the process of heating the substrate W using the heating plate 112 to dry the substrate W and the process of discharging the vapor of organic solvent to dry the substrate W.

A discharge nozzle 131 is provided adjacent to the discharge nozzle 141 near the inner upper portion of the upper cover 115. The discharge nozzle 131 is a nozzle for discharging a cooling gas and the process gas toward the substrate W. As shown in FIG. 2, the discharge nozzle 131 is in communication with a cooling gas source 167 through a pipe 132, a branch pipe 162 and a valve 165, and is also in communication with a process gas source 137 through the pipe 132 and a valve 135. Thus, the process gas is discharged into the container interior 110 by opening the valve 135 and closing the valve 165. The cooling gas is discharged toward the substrate W by opening the valve 165 and closing the valve 135.

Although a cooled helium gas is used as the cooling gas in this preferred embodiment, the cooling gas is not limited to this, but may be a gas chemically stable (inert) and high in specific heat. The process gas source 137 used in FIG. 2 according to the first preferred embodiment is separate from the process gas source 149. However, a common process gas source may be used to supply the same process gas.

Figure 3:
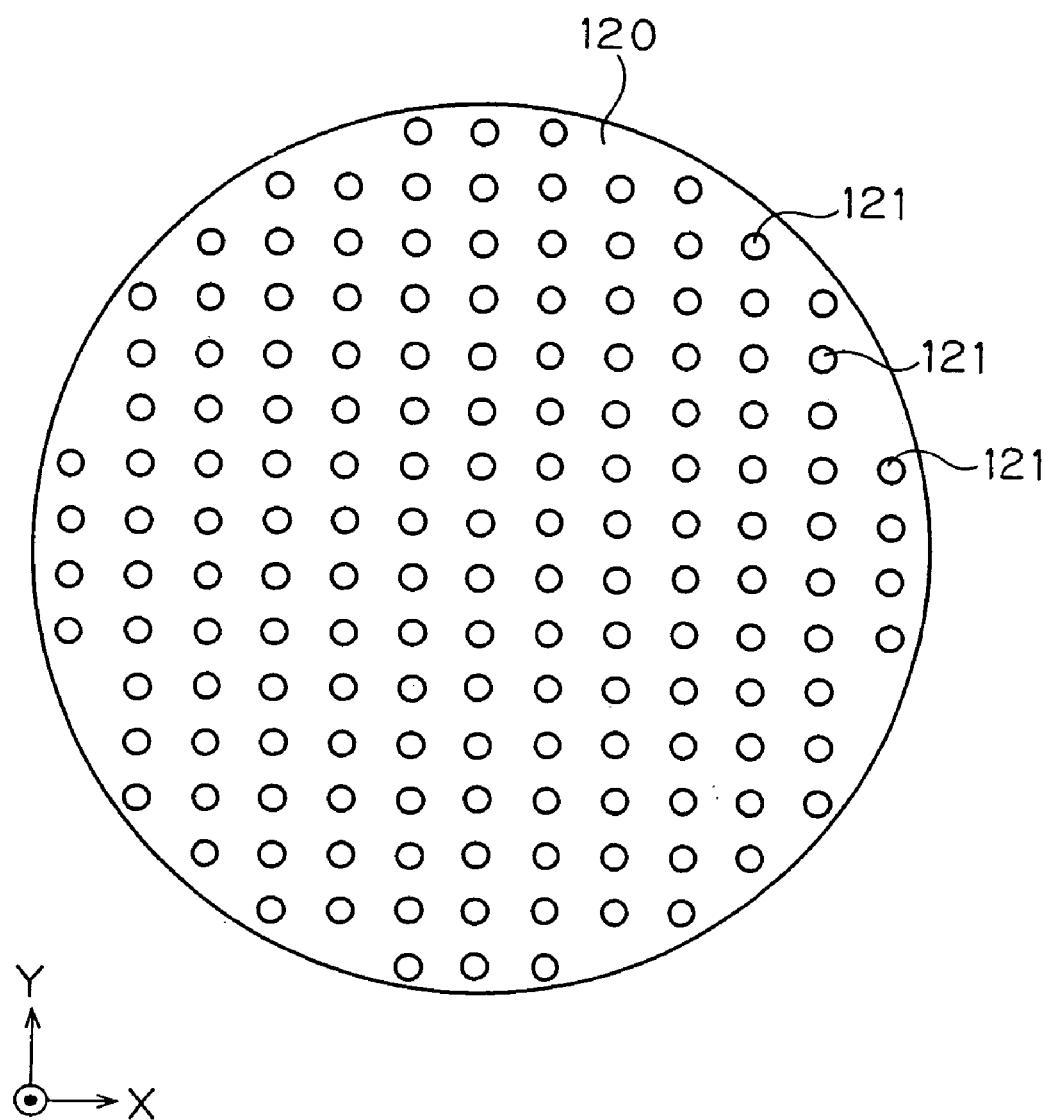
FIG. 3 is a schematic plan view of a diffusion plate according to the first preferred embodiment.

A diffusion plate 120 is provided between the discharge nozzles 131, 141 and the heating plate 112. FIG. 3 is a schematic plan view of the diffusion plate 120 according to the first preferred embodiment. As illustrated in FIGS. 2 and 3, the diffusion plate 120 is a substantially circular plate-like member having a size approximately equal to the inside diameter of the upper cover 115, and is formed with a multiplicity of through holes 121. The vapor of organic solvent discharged from the discharge nozzle 141 toward the substrate W is diffused by the multiplicity of through holes 121 and then reaches the substrate W.

Thus, the vapor of organic solvent is supplied more uniformly to the surface of the substrate W than if the diffusion plate 120 is not used. Not only water or moisture adhering to the surface of the substrate W but also water or moisture entering a space between lines, the inside of holes and the inside of resist films of fine patterns formed on the substrate W is reliably replaced with the vapor of organic solvent, whereby the substrate W is dried. Similarly, the diffusion plate 120 is also capable of diffusing the cooling gas discharged from the discharge nozzle 131 to uniformly supply the cooling gas to the surface of the substrate W. This accomplishes efficient cooling of the substrate W.

The base part 117 is provided with two exhaust outlets 151. The exhaust outlets 151 are in communication with an exhaust drain 157 through a pipe 152, a pump 153 and a valve 155. Therefore, the container 105 is placed into an enclosed condition, and the pump 153 is operated, with the valve 155 open, to exhaust the atmosphere in the container interior 110 to the outside of the container 105, thereby creating a reduced-pressure atmosphere in the container interior 110.

Description will be given on a substrate processing procedure for removing the polymer residue deposited on the substrate W by the use of the substrate processing apparatus 1 according to the first preferred embodiment. The processing of the substrate processing apparatus 1 principally comprises: (1) a removal process step for removing the polymer residue deposited on the substrate W in the removal part 20; and (2) a drying process step for drying the substrate W in the drying part 50. The apparatus 1 is a single wafer processing apparatus which sequentially processes substrates one by one.

Each of the drying units 100 which are the components of the drying part 50 are capable of selectively performing the organic solvent drying process and the heating drying process, as described above. The organic solvent drying process in which the substrate W is dried by supplying the vapor of organic solvent to near the substrate W while the reduced-pressure atmosphere is created in the container interior 110 will be described in this preferred embodiment.

First, a plurality of substrates W received in a carrier C are transported into the loading part 11 (See FIG. 1). Each of the substrates W has a thin film subjected to dry etching using a patterned resist film as a mask. Reaction products (polymer) derived from the resist film and the thin film are deposited on the substrates W.

The loading/unloading mechanism 17 unloads one of the substrates W from the carrier C in the loading part 11 onto the transfer table 19. Next, the transport unit 26 takes out the substrate W placed on the transfer table 19. Subsequently, the transport unit 26 moves to the front of the shutter 25 of one of the four removal units 30. The transport unit 26 then loads the substrate W through an opening produced by opening the shutter 25 into the rotary holding part 31 in the processing chamber 21. After the loading of the substrate W, the shutter 25 is closed to enclose the processing chamber 21. This prevents the mist or vapor of processing solution generated during the polymer removal process in the processing chamber 21 from leaking out of the processing chamber 21.

Next, the selected removal unit 30 performs the removal of the polymer residue deposited on the substrate W. First, a removal solution for selectively removing only the polymer residue formed on the substrate is discharged toward the substrate W while the substrate W is held and rotated by the rotary holding part 31. The removal solution dissolves the polymer residue deposited on the bottom and side walls of wiring patterns. Then, the discharge of the removal solution is stopped, and a rinsing process is carried out for discharging a rinsing solution (e.g., deionized water) toward the substrate W while rotating the substrate W. The rinsing solution rinses off contaminants including the removal solution adhering to the substrate W and the dissolved reaction products from the substrate W. After the rinsing process, the supply of deionized water to the substrate W is stopped, and the rotation speed of the rotary holding part 31 is increased so that water or moisture adhering to the substrate W is spun off by centrifugal force created by rotation. This removes most of the water or moisture adhering to the substrate W, but water or moisture still remains in a microstructure including lines and holes on the substrate W.

After the polymer removal process in the removal unit 30, the substrate W subjected to the polymer removal process is transported from the removal unit 30 to one of the drying units 100. More specifically, the transport unit 26 unloads the substrate W from the removal unit 30 onto the transfer table 49. Next, the transport unit 56 takes out the substrate W from the transfer table 49, and loads the substrate W into one of the drying units 100.

Specifically, in the selected drying unit 100, the shutter 59 of the processing chamber 51 is opened, and the elevating mechanism 116 moves the upper cover 115 of the container 105 upwardly in the direction of the arrow AR1. Then, the substrate W is transferred from the transport unit 56 to the support pins 111 in their raised position (See FIG. 4). After the loading of the substrate W, the shutter 59 is closed and the upper cover 115 is moved downwardly to ensure the hermeticity of the container 105.

Next, the drying process is performed on the substrate W in the drying unit 100. In the drying unit 100, the pump 153 exhausts the atmosphere in the container interior 110 to the exhaust drain 157 to provide a low-pressure atmosphere in the container interior 110, and the vapor of organic solvent is supplied through the discharge nozzle 141, whereby the substrate W supported by the support pins 111 is dried efficiently.

FIGS. 5A, 5B, 5C and 5D show a relationship between the supply rate of the vapor of organic solvent, the supply rate of the process gas and an output from the pump 153, and the pressure in the container interior 110. The horizontal axes of FIGS. 5A to 5D indicate time t. The vertical axis of FIG. 5A indicates the supply rate Vi per unit time of the vapor of organic solvent as a function of time t, and the vertical axis of FIG. 5B indicates the supply rate Vp per unit time of the process gas as a function of time t. The vertical axis of FIG. 5C indicates the output Wp from the pump 153 as a function of time t, and the vertical axis of FIG. 5D indicates the pressure P in the container interior 110 as a function of time t.

At time t11 at which the drying process starts, the pressure P in the container interior 110 has a value P11 approximately equal to atmospheric pressure because the output Wp from the pump 153 equals "zero." The supply rate Vi of the vapor of organic solvent and the supply rate Vp of the process gas are both "zero" because the valves 145 and 135 are closed. Prior to the time t11 at which the drying process starts, the pump 153 is driven and the valve 135 is open to previously replace the atmosphere in the container 105 with a process gas atmosphere.

When the controller 90 sets the output Wp from the pump 153 at a value Wp11 at time t11, the output Wp from the pump 153 gradually increases from "zero" toward the value Wp 11. This causes the atmosphere in the container interior 110 to be exhausted to the exhaust drain 157, to gradually decrease the pressure P in the container interior 110 from the value P11, thereby providing a reduced-pressure atmosphere.

Next, at time t12 at which the pressure P in the container interior 110 reaches a value P13, the output Wp from the pump 153 is set at "zero," and the valves 145 and 146 are opened. The supply rate Vi per unit time of the vapor of organic solvent discharged from the discharge nozzle 141 toward the substrate W gradually increases from "zero" to reach a value Vi11.

The vapor of organic solvent discharged from the discharge nozzle 141 passes through the multiplicity of through holes 121 distributed substantially uniformly in the diffusion plate 120 provided under the discharge nozzle 141 to reach the substrate W. The vapor of organic solvent, which is diffused by the diffusion plate 120, is uniformly supplied to the substrate W to create an atmosphere containing the vapor of organic solvent near the substrate W. The pressure value P13 at the point of time when the output from the pump 153 is set at "zero" and the supply of the vapor of organic solvent to the container interior 110 starts is a value determined depending on the drying time of the substrate W and the exhaust capability of the pump 153, and is previously obtained by experiment and the like.

At time t13 at which the supply of the vapor of organic solvent causes the pressure P in the container interior 110 to reach a value P12, the valves 145 and 146 are closed, and the supply of the vapor of organic solvent to the container interior 110 is stopped. Then, the pressure in the container interior 110 is held at the constant value P12. During a time interval between t13 and t14, the vapor of organic solvent and the process gas are not supplied to the container interior 110, and the atmosphere in the container interior 110 is not exhausted to the exhaust drain 157 because the output Wp from the pump 153 is set at "zero." Thus, the pressure P in the container interior 110 is held at the constant value P12 lower than atmospheric pressure during the time interval between t13 and t14.

This suppresses a gas flow directed downwardly inside the container 105, to allow the atmosphere containing the vapor of organic solvent near the substrate W to remain stable without turbulence due to the gas flow. The result is an improvement in efficiency of replacement of not only water or moisture adhering to the surface of the substrate W but also water or moisture entering a space between lines, the inside of holes and the inside of resist films of the fine patterns formed on the substrate W with the vapor of organic solvent, which provides accordingly improved drying efficiency.

The time interval T1 (between t13 and t14) during which the pressure P in the container interior 110 is held at the constant value P12 lower than atmospheric pressure is determined depending on the material of the substrate W, the pressure in the container interior 110 and the like, and may be previously obtained by experiment and the like.

Next, when the controller 90 sets the output Wp from the pump 153 at the value Wp11 at time t14 which is the time interval T1 later than the time t13, the output Wp from the pump 153 gradually increases from "zero" to reach the constant value Wp11. The pump 153 exhausts the vapor of organic solvent and the vapor of water contained in the atmosphere in the container interior 110 to the exhaust drain 157.

At time t15 at which the pressure P in the container interior 110 reaches the value P13, the valve 135 is opened while the output Wp from the pump 153 is held at the value Wp11. Then, the supply rate Vp per unit time of the process gas to the container interior 110 gradually increases from "zero" to reach a constant value Vp11. Therefore, the vapor of organic solvent and the vapor of water contained in the atmosphere in the container interior 110 are replaced with the process gas and exhausted to the exhaust drain 157.

At time t16 at which almost all of the vapor of organic solvent in the container interior 110 is exhausted to the exhaust drain 157, the controller 90 sets the output Wp from the pump 153 at "zero". The output Wp from the pump 153 gradually decreases from the value Wp11 to "zero." The pressure in the container interior 110 accordingly increases rapidly. Next, at time t17 at which the pressure P in the container interior 110 reaches a value P14, the valve 135 is closed to stop the supply of the process gas. The drying unit 100 completes the drying process at time t18 at which the pressure P in the container interior 110 reaches the value P11 approximately equal to atmospheric pressure.

Since the completion of the drying process in the drying unit 100 is the completion of the substrate processing, the processed substrate W is transported toward the unloading part 13. More specifically, the elevating mechanism 116 moves the upper cover 115 upwardly in the direction of the arrow AR1 (See FIG. 4), and the shutter 59 is opened. The transport unit 56 unloads the substrate W held by the support pins 111 from the drying unit 100. Next, the transport unit 56 having received the substrate W places the substrate W on the transfer table 49.

Thereafter, the transport unit 26 takes out the processed substrate W placed on the transfer table 49 to place the substrate W on the transfer table 19. The loading/unloading mechanism 17 takes out the processed substrate W placed on the transfer table 19, and loads the processed substrate W into a carrier C placed on the unloading part 13. The transport mechanism not shown transports the carrier C placed on the unloading part 13 to the outside of the substrate processing apparatus 1.

The transfer tables 19 and 49 may be constructed by a plurality of substrate holding means, e.g. multi-tier holding tables, which can lay unprocessed and processed substrates W at the same time in the interface 40, to thereby prevent the reduction in throughput.

In the first preferred embodiment, while the reduced-pressure atmosphere is provided in the container interior 110 by the pump 153, the vapor of organic solvent is supplied toward the substrate W placed in the container 105. This reliably accomplishes the replacement of not only water or moisture adhering to the surface of the substrate W but also water or moisture entering the microstructure formed on the substrate W, i.e. a space between lines, the inside of holes and the inside of resist films, with the vapor of organic solvent, to dry the substrate W.

The provision of the diffusion plate 120 between the discharge nozzle 141 and the substrate W causes the vapor of organic solvent discharged from the discharge nozzle 141 toward the substrate W to diffuse through the through holes 121 of the diffusion plate 120 to reach the substrate W. Thus, the vapor of organic solvent is diffused more efficiently and is supplied more uniformly to near the substrate W than if the diffusion plate 120 is not used.

In the drying process according to the first preferred embodiment, the reduced-pressure atmosphere is provided in the container interior 110, and the vapor of organic solvent is supplied to near the substrate W. Subsequently, the output Wp from the pump 153 is reduced to "zero" and the supply of the vapor of organic solvent to the container interior 110 is stopped, so that the pressure in the container interior 110 is held at the constant value P12. This allows the vapor of organic solvent to remain stable near the substrate W. The result is more efficient replacement of water or moisture entering a space between lines, the inside of holes and the inside of resist films of the fine patterns formed on the substrate W with the vapor of organic solvent, which improves the drying efficiency.

2. Second Preferred Embodiment

A second preferred embodiment according to the present invention uses the substrate processing apparatus 1 of the first preferred embodiment, and features (1) supplying the processing solution (the removal solution and deionized water) to the substrate W to remove the polymer residue deposited on the substrate W in the removal part 20, and (2) then heating the substrate W in a reduced-pressure atmosphere to remove water or moisture on the surface of the substrate W, thereby drying the substrate W in the drying part 50. The substrate processing of the second preferred embodiment differs from that of the first preferred embodiment only in the drying process performed in the drying part 50, but is similar to that of the first preferred embodiment in hardware construction and in the process of removing the polymer residue performed in the removal part 20. The difference will be principally described in the second preferred embodiment.

After the polymer removal process, the transport unit 26, the transfer table 49 and the transport unit 56 are used to transport the substrate W onto the support pins 111 in the container 105. The upper cover 115 is moved downwardly and the support pins 111 are moved downwardly. Then, the heating plate 112 performs a drying process on the substrate W.

FIGS. 6A, 6B, 6C, 6D and 6E show the control timing of the supply rate of the cooling gas, an output from the heating plate, the supply rate of the process gas and the output from the pump, and the pressure in the container interior in the drying process according to the second preferred embodiment. The horizontal axes of FIGS. 6A to 6E indicate time t. The vertical axis of FIG. 6A indicates the supply rate Vc per unit time of the cooling gas as a function of time t, and the vertical axis of FIG. 6B indicates an output (power) Wh from the heating plate 112 as a function of time t. The vertical axis of FIG. 6C indicates the supply rate Vp per unit time of the process gas as a function of time t, and the vertical axis of FIG. 6D indicates the output Wp from the pump 153 as a function of time t. The vertical axis of FIG. 6E indicates the pressure P in the container interior 110 as a function of time t.

At time t21 at which the drying process starts, the pressure P in the container interior 110 has a value P21 approximately equal to atmospheric pressure because the output Wp from the pump 153 equals "zero." The output Wh from the heating plate 112 is set at "zero." The supply rate Vp of the process gas is "zero" because the valve 135 is closed. Prior to the time t21 at which the drying process starts, the pump 153 is driven and the valve 135 is opened to previously replace the atmosphere in the container 105 with a process gas atmosphere.

The output Wp from the pump 153 gradually increases from "zero" toward a value Wp21 at time t21. This causes the atmosphere in the container interior 110 to be exhausted to the exhaust drain 157, to gradually decrease the pressure P in the container interior 110 from the value P21, thereby providing a reduced-pressure atmosphere. The controller 90 sets the output Wh from the heating plate 112 at a value Wh21 at time t21. This gradually increases the output Wh from the heating plate 112 from "zero" toward the value Wh21 to raise the temperature of the upper surface of the heating plate 112. Heat transfers from the upper surface of the heating plate 112 to the bottom surface of the substrate W to raise the temperature of the substrate W.

The second preferred embodiment handles the drying process, in particular, in the process step (also referred to hereinafter as a "back-end process step") of forming interconnections and insulative films on the substrate W. It is difficult to heat the substrate W in the process step (also referred to hereinafter as a "front-end process step") of forming circuit elements such as transistors and capacitors in a silicon layer. In the back-end process step, however, the substrate W heated and dried is little affected by water marks, but is dried satisfactorily.

Prior to the time t21 at which the drying process starts, the inert process gas atmosphere is produced in the container 105, and oxygen in the container interior 110 is replaced with the process gas, as discussed above. That is, a reduced-oxygen atmosphere is created in the container interior 110. This prevents oxidation of metals used for wiring patterns, such as Al and Cu, formed on the substrate W if the temperature of the substrate W is raised.

It is known that the metals used for wiring patterns, such as Al and Cu, formed on the substrate W undergo oxidation even in the reduced-oxygen atmosphere in the drying process step of the second preferred embodiment if the temperature of the substrate W exceeds 300 degrees centigrade. For this reason, the temperature of the substrate W during the drying of the substrate W by heating according to the second preferred embodiment is within the range of 150 degrees centigrade higher than the boiling point of deionized water to 300 degrees centigrade lower than the temperature at which the wiring patterns undergo oxidation even in the reduced-oxygen atmosphere (preferably within the range of 240 degrees centigrade to 260 degrees centigrade).

Next, at time t22 at which the pressure P in the container interior 110 reaches a value P22, the output Wp from the pump 153 is set at "zero." The exhaust of the atmosphere in the container interior 110 to the outside of the container 105 is stopped. Then, the pressure in the container interior 110 is held at the constant value P22.

During a time interval between t22 and t24, the process gas is not supplied to the container interior 110, and the atmosphere in the container interior 110 is not exhausted to the exhaust drain 157, whereby the pressure P in the container interior 110 is held at the constant value P22 lower than atmospheric pressure. Heating of the substrate W continues during the time interval between t22 and t24, to suppress a gas flow directed downwardly inside the container 105.

This prevents the turbulence of the atmosphere near the substrate W, to achieve satisfactory heat transfer from the heating plate 112 to the substrate W. As a result, the efficient heating of the substrate W is achieved to efficiently remove not only water or moisture adhering to the surface of the substrate W but also water or moisture entering a space between lines, the inside of holes and the inside of resist films of the fine patterns formed on the substrate W, thereby drying the substrate W.

The time interval T2 (between t22 and t24) during which the pressure P in the container interior 110 is held at the constant value P22 is determined depending on the material of the substrate W, the pressure in the container interior 110 and the like, and may be previously obtained by experiment and the like.

Next, when the controller 90 sets the output Wp from the pump 153 at the value Wp21 at time t24 which is the time interval T2 later than the time t22, the output Wp from the pump 153 gradually increases from "zero" to reach the constant value Wp21. The pump 153 continues to exhaust the vapor of water contained in the atmosphere in the container interior 110 to the exhaust drain 157.

At time t25 at which vaporization of water or moisture from the substrate W is completed, the valve 135 shown in FIG. 2 is opened while the output Wp from the pump 153 is held at the value Wp21. Then, the supply rate Vp per unit time of the process gas to the container interior 110 gradually increases from "zero" to reach a constant value Vp21. Therefore, the vapor of water contained in the atmosphere in the container interior 110 is replaced with the process gas and continues to be exhausted to the exhaust drain 157.

Additionally, at time t25, the valve 165 in communication with the cooling gas source 167 is opened, and the controller 90 sets the output Wh from the heating plate 112 at "zero." Then, the supply rate Vc per unit time of the cooling gas gradually increases from "zero" to reach a value Vc21, and the output Wh from the heating plate 112 gradually decreases from the value Wh21 to "zero." This allows the heating of the substrate W to stop, and the cooling gas to be discharged toward the substrate W, thereby to cool the substrate W. The container interior 110 is filled with the chemically inert process gas and the cooling gas, and contains the reduced-oxygen atmosphere. This prevents oxidation of metals used for wiring patterns, such as Al and Cu, formed on the substrate W during the cooling of the substrate W as well as during the heating of the substrate W.

At time t26 at which almost all of the vapor of water in the container interior 110 is exhausted to the exhaust drain 157, the controller 90 sets the output Wp from the pump 153 at "zero". The output Wp from the pump 153 gradually decreases from the value Wp21 to "zero." The pressure in the container interior 110 accordingly increases rapidly. Next, at time t27 at which the pressure P in the container interior 110 reaches a value P24, the valves 135 and 165 are closed to stop the supply of the process gas and the cooling gas. The drying unit 100 completes the drying process at time t28 at which the pressure P in the container interior 110 reaches the value P21 approximately equal to atmospheric pressure.

Figure 4:
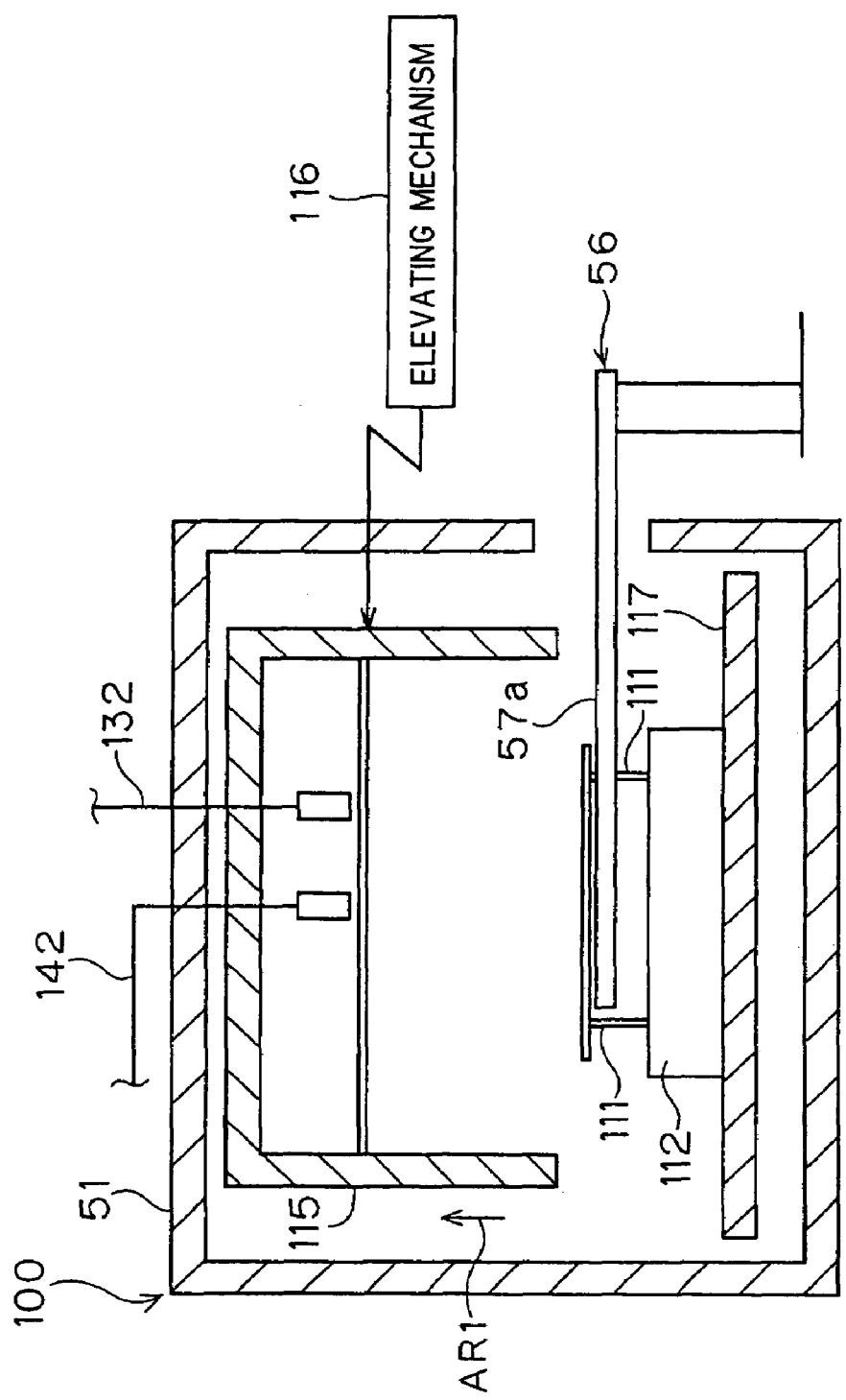
FIG. 4 is a schematic front view of the drying unit according to the first preferred embodiment.
Figure 5A:
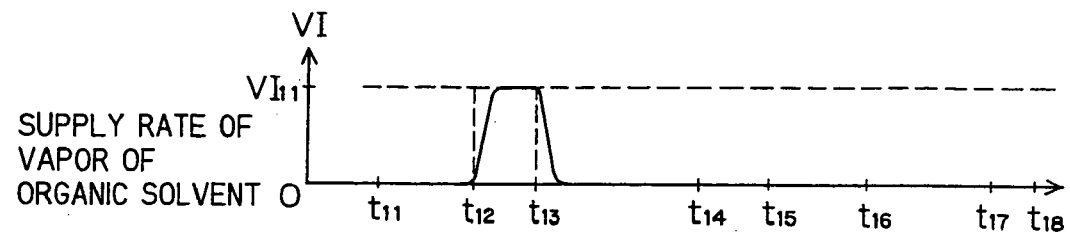
FIGS. 5A, 5B, 5C and 5D show the control timing of the supply rate of isopropyl alcohol, the supply rate of a process gas and a pump output, and the pressure in a container interior according to the first preferred embodiment.
Figure 5B:
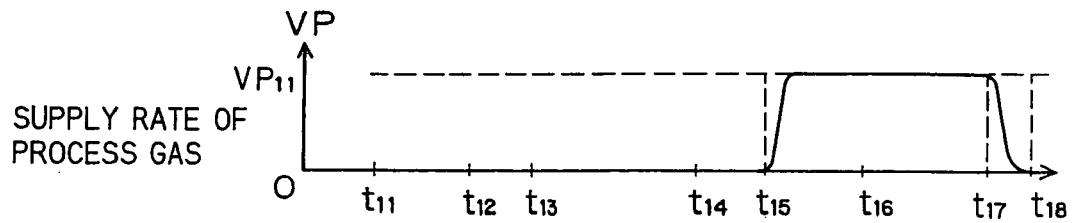
Figure 5C:
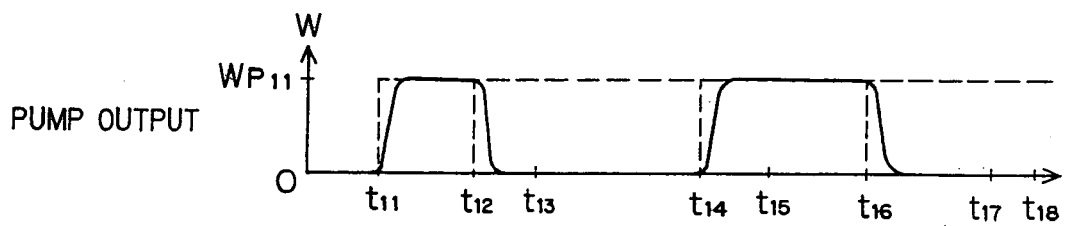
Figure 5D:
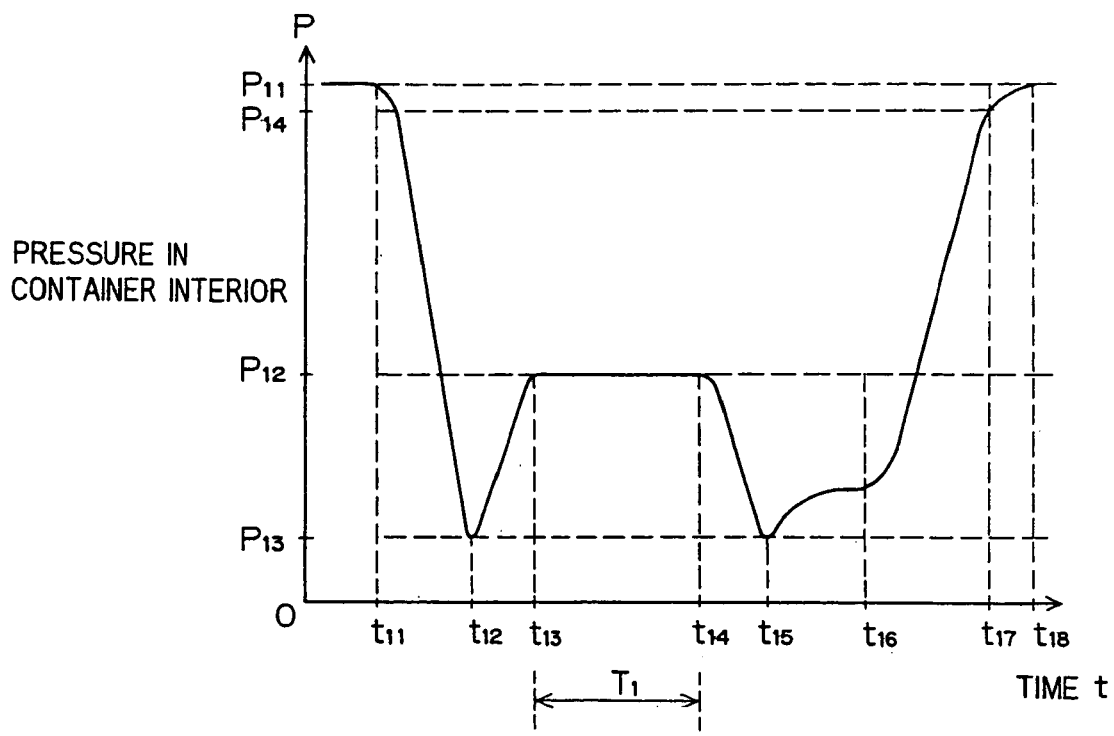
Figure 6A:
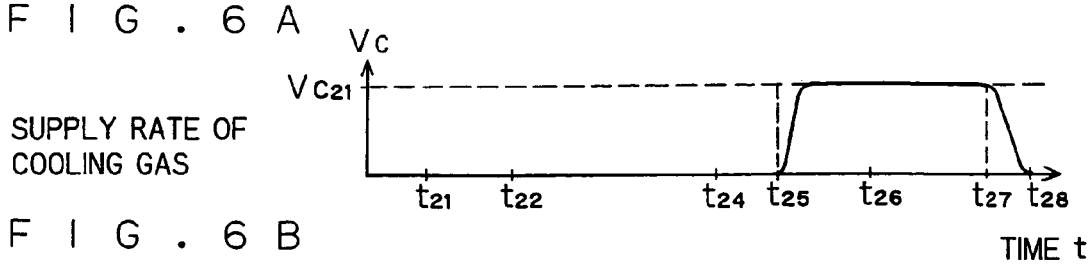
FIGS. 6A, 6B, 6C, 6D and 6E show the control timing of the supply rate of a cooling gas, a heating plate output, the supply rate of the process gas and the pump output, and the pressure in the container interior according to a second preferred embodiment of the present invention.
Figure 6B:
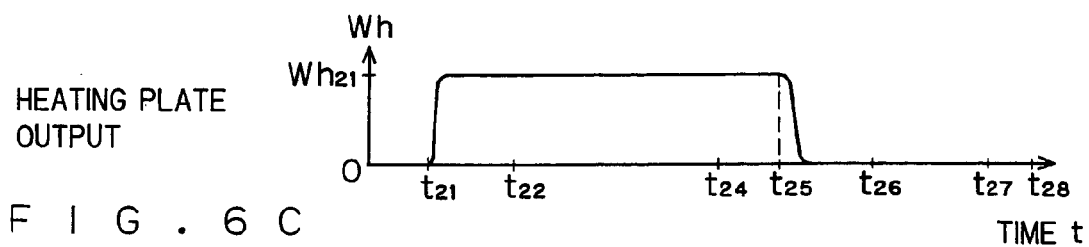
Figure 6C:
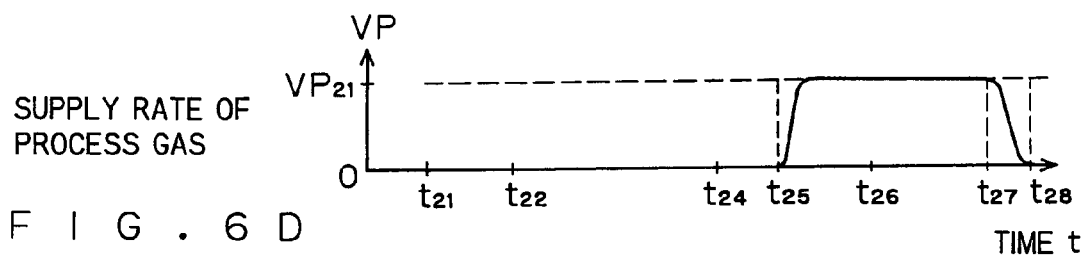
Figure 6D:
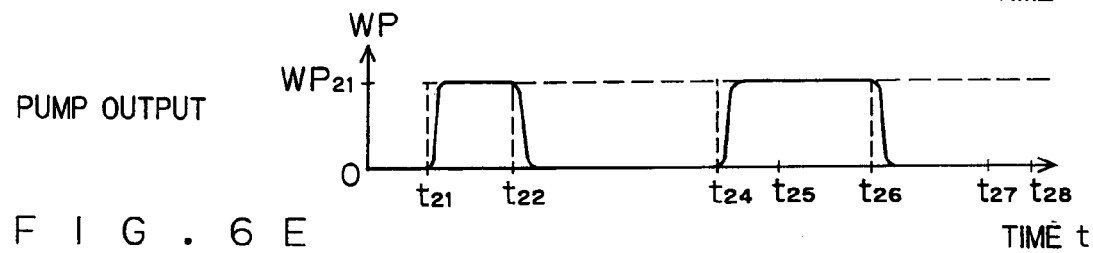
Figure 6E:
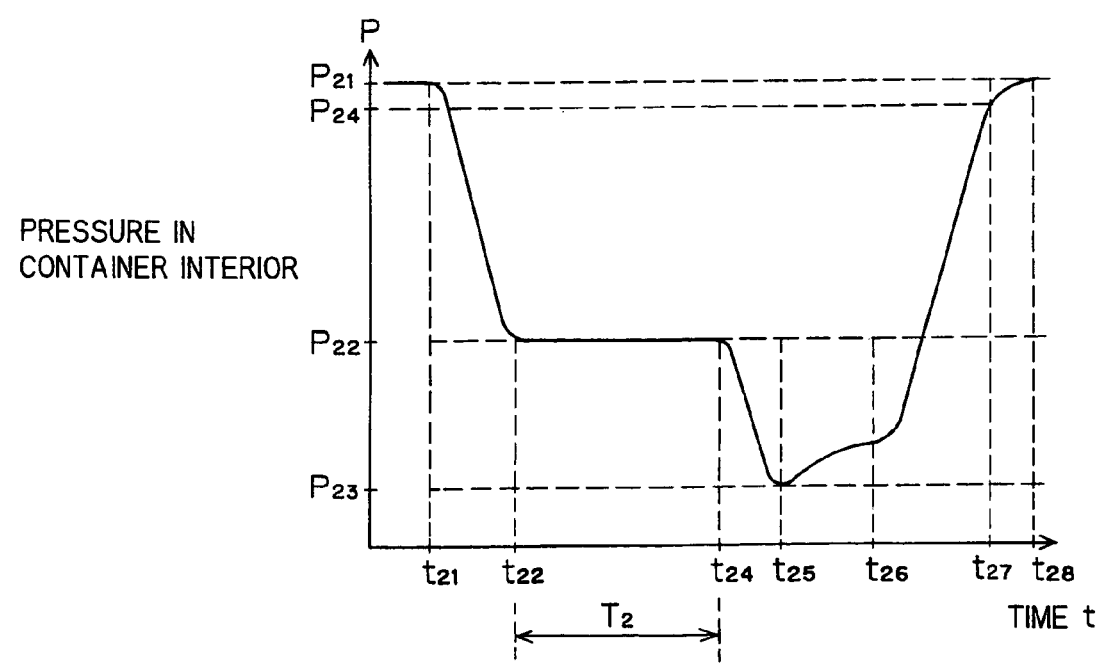

Since the completion of the drying process in the drying unit 100 is the completion of the substrate processing, the processed substrate W is transported toward the unloading part 13. More specifically, as shown in FIG. 4, the support pins 111 mounted upright on the heating plate 112 are moved upwardly, and the elevating mechanism 116 moves the upper cover 115 upwardly in the direction of the arrow AR1. Also, the shutter 59 is opened. Next, the transport unit 56 unloads the substrate W supported by the support pins 111 from the drying unit 100. The transfer table 49, the transport unit 26, the transfer table 19 and the loading/unloading mechanism 17 are used to load the processed substrate W unloaded from the drying unit 100 into a carrier C placed on the unloading part 13, as in the first preferred embodiment. The transport mechanism not shown transports the carrier C containing the substrate W subjected to the substrate processing to the outside of the substrate processing apparatus 1.

In the second preferred embodiment, the pump 153 decreases the pressure of the atmosphere containing the process gas substituted for oxygen in the container 105, whereby the substrate W is dried by heating in the reduced-pressure reduced-oxygen atmosphere. Therefore, the second preferred embodiment prevents oxidation of metals used for wiring patterns, such as Al and Cu, formed on the substrate W if the temperature of the substrate W is raised by heating. Further, because the substrate W is cooled similarly in the reduced-oxygen atmosphere, the second preferred embodiment prevents oxidation of metals used for wiring patterns, such as Al and Cu, formed on the substrate W during the cooling of the substrate W raised in temperature.

3. Third Preferred Embodiment

Figure 7:
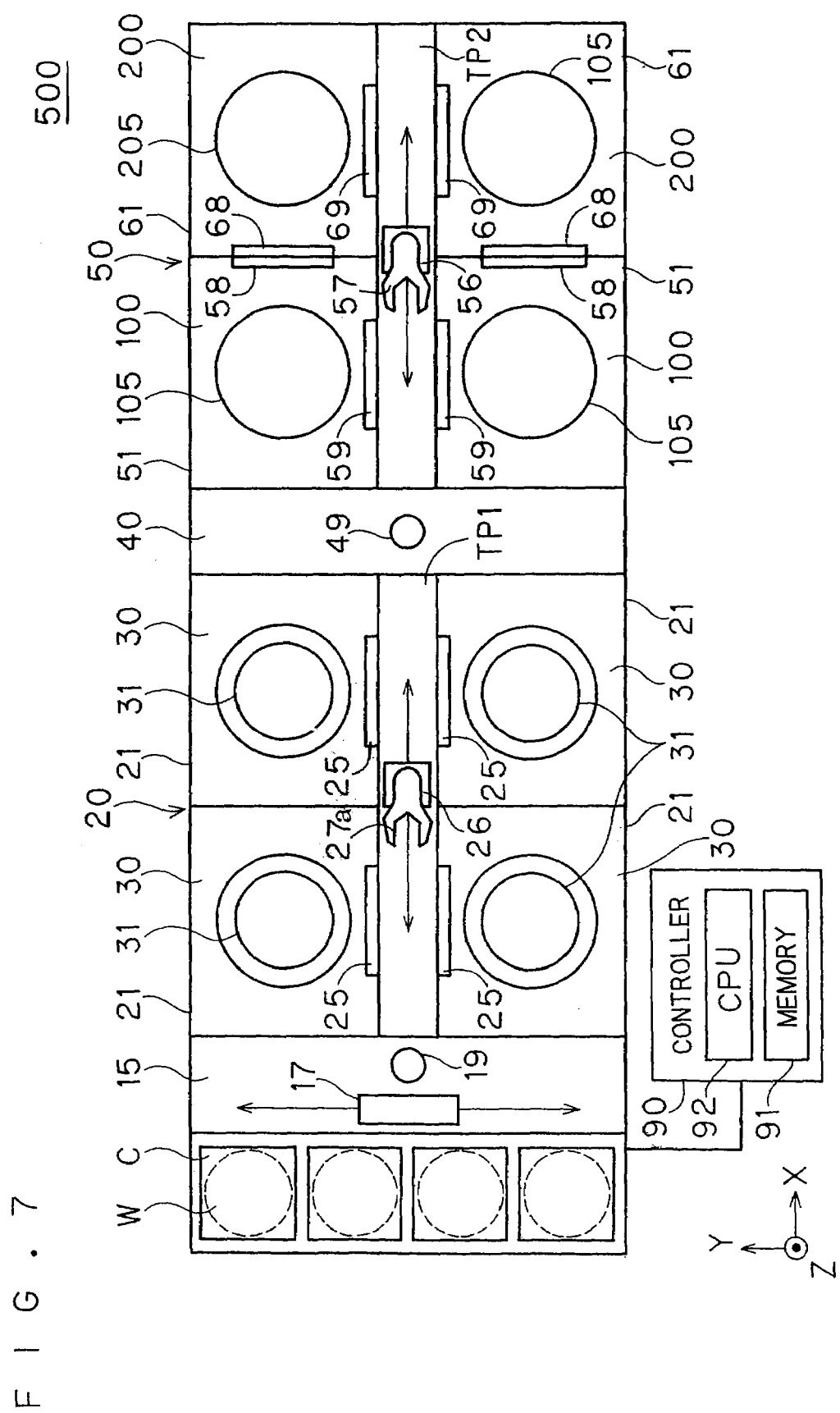
FIG. 7 is a schematic plan view showing the overall construction of the substrate processing apparatus according to a third preferred embodiment of the present invention.
Figure 8:
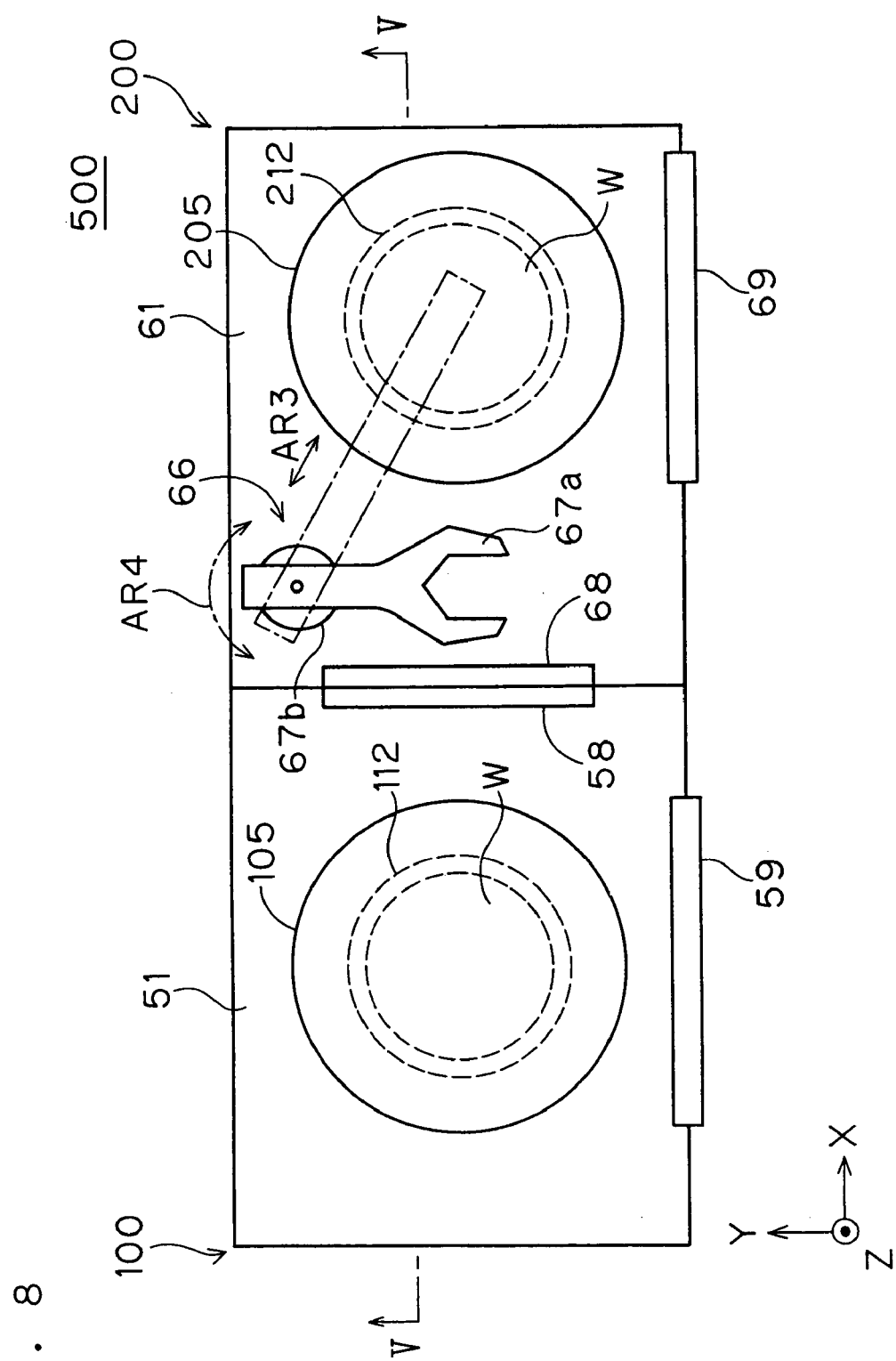
FIG. 8 is a schematic plan view of a drying unit and a cooling unit according to the third preferred embodiment.
Figure 9:
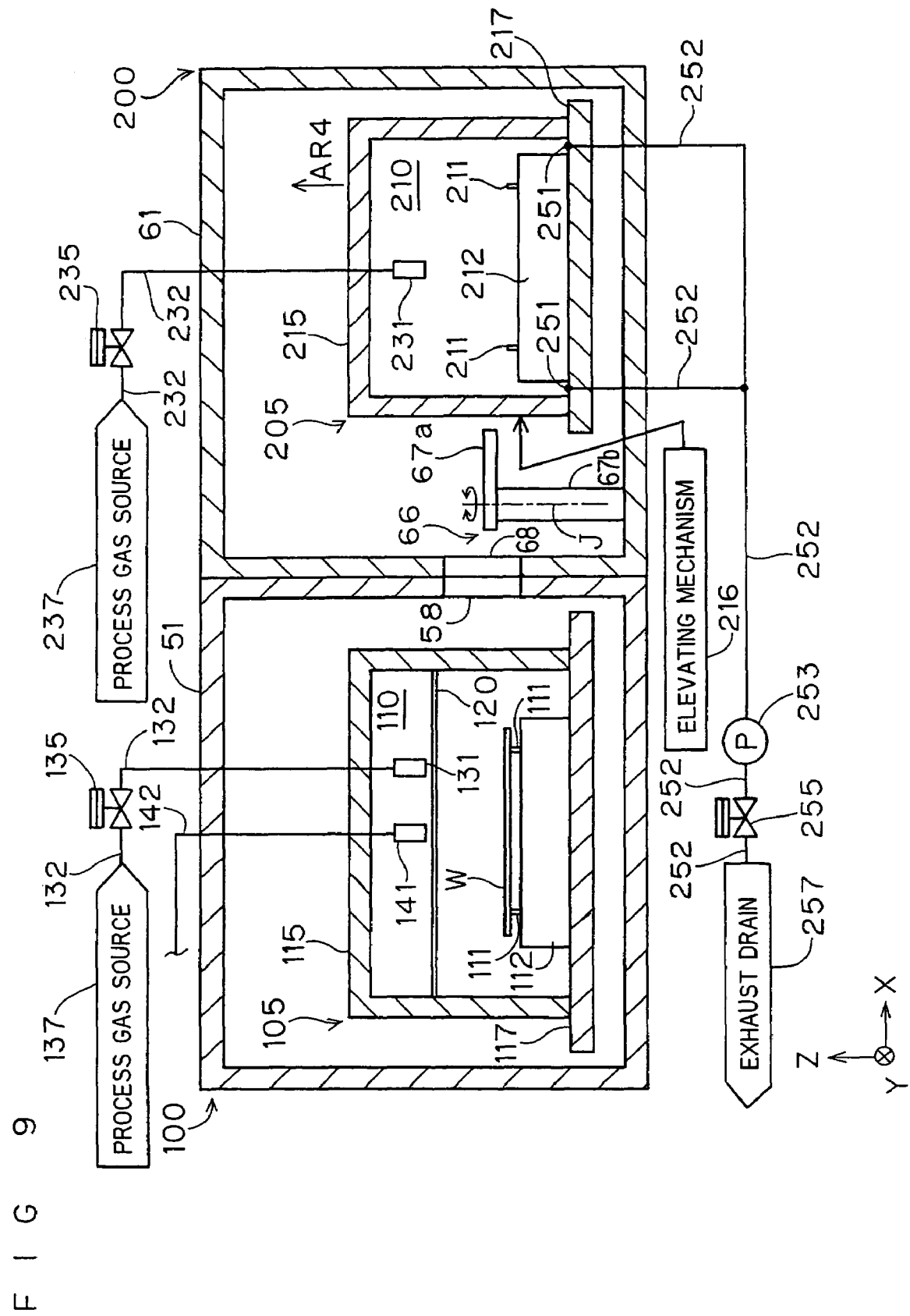
FIGS. 9, 10 and 11 are sectional views of the drying unit and the cooling unit taken along the line V-V of FIG. 8.
Figure 10:
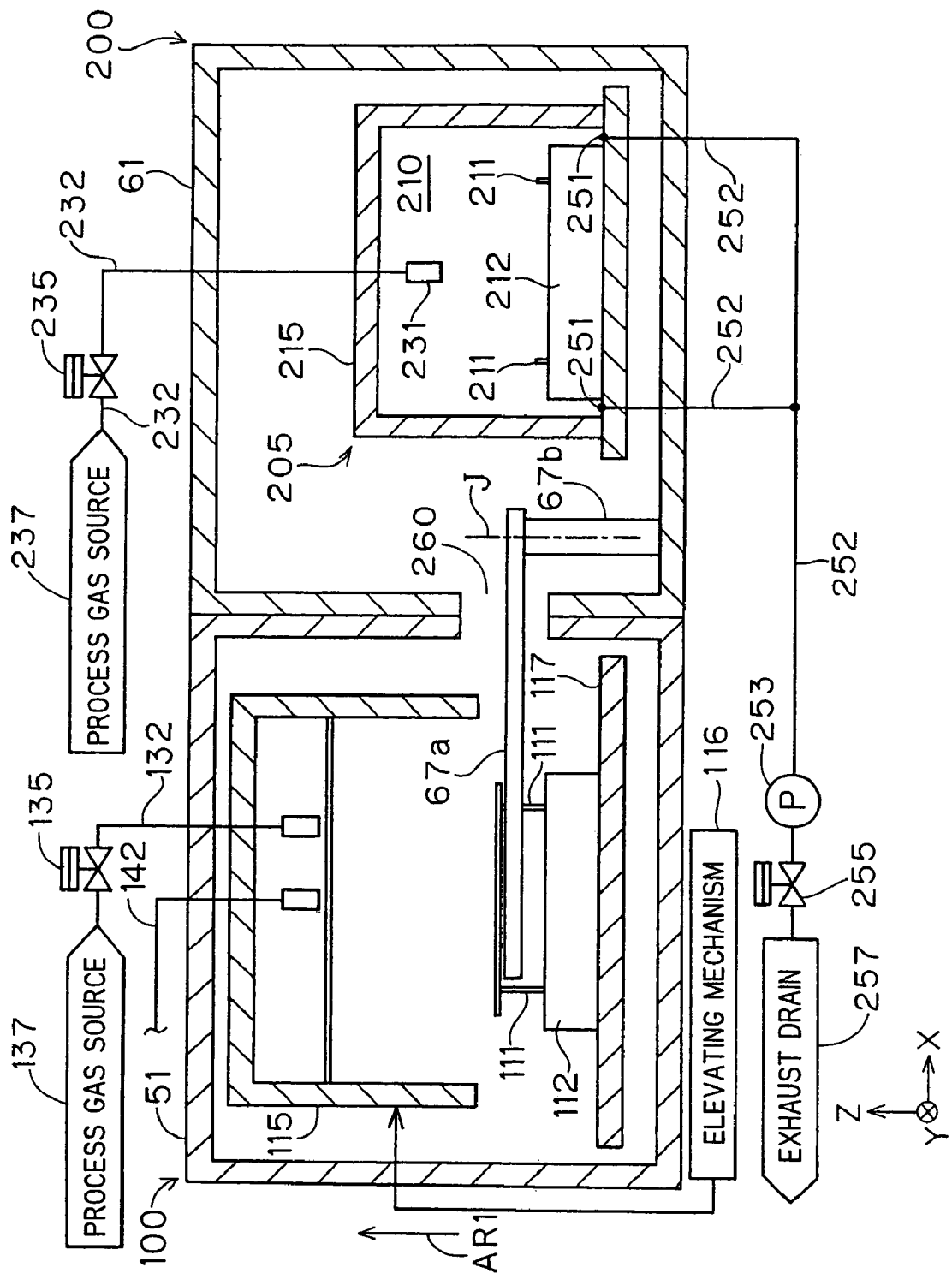
Figure 11:
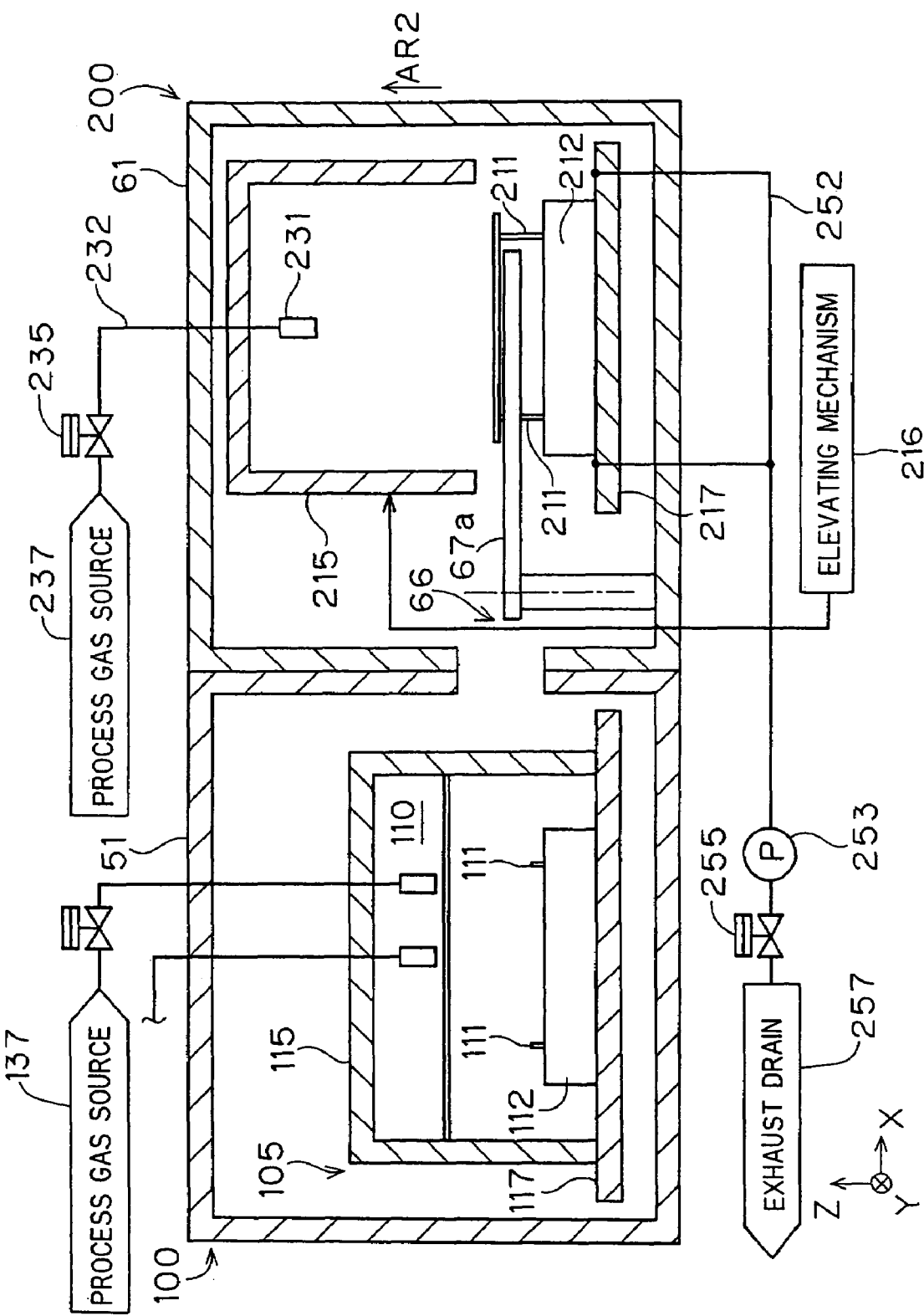

A substrate processing apparatus 500 according to a third preferred embodiment of the present invention will be described. FIG. 7 is a schematic plan view showing the overall construction of the substrate processing apparatus 500 according to the third preferred embodiment of the present invention. FIG. 8 is a schematic plan view of a drying unit 100 and a cooling unit 200 according to the third preferred embodiment. FIGS. 9 to 11 are sectional views of the drying unit 100 and the cooling unit 200 taken along the line V-V of FIG. 8.

The substrate processing apparatus 500 of the third preferred embodiment, which is similar to the substrate processing apparatus 1 of the first preferred embodiment, is an apparatus for removing the polymer residue deposited on the substrate W. As shown in FIGS. 7 to 11, the substrate processing apparatus 500 of the third preferred embodiment is similar in hardware construction to the substrate processing apparatus 1 of the first preferred embodiment except that the drying part 50 comprises cooling units 200 in addition to the drying units 100 so that the heating process and the cooling process are performed in different processing units. In the third preferred embodiment, description will be given principally on the difference from the hardware construction of the first preferred embodiment, that is, on the cooling units 200 added to the drying part 50.

Like reference numerals and characters are used in the following description to designate components similar to those of the substrate processing apparatus 1 of the first preferred embodiment. Since these components designated by the like reference numerals and characters have been described in the first preferred embodiment, description about these components will be omitted in the third preferred embodiment.

As illustrated in FIG. 7, the drying part 50 is provided adjacent to the interface 40. The drying part 50 includes two drying units 100 for drying the substrate W by heating, two cooling units 200 for cooling the substrate W using a cooling gas, and the transport unit 56 for transferring and receiving the substrate W to and from each of the drying units 100 and cooling units 200.

As for the flow of the substrate W in the substrate processing apparatus 500, the indexer 10 is defined herein as being upstream, and the drying part 50 as being downstream. The drying units 100 and the cooling units 200 are spaced in two lines arranged in the Y direction, each of the lines being formed by one drying unit 100 on the upstream side and one cooling unit 200 on the downstream side which are arranged in the direction (X direction) perpendicular to the Y direction. The transport unit 56 is in the transport passage TP2 lying between the two lines of the units.

As in the second preferred embodiment, each of the drying units 100 of the third preferred embodiment heats the substrate in the reduced-pressure atmosphere to dry the substrate W. The processing chamber 51 has an enclosure structure which closes off communication between the interior and exterior of the processing chamber 51. As shown in FIGS. 7 and 8, a wall surface of the processing chamber 51 which faces the transport passage TP2 is provided with the shutter 59, and a wall surface of the processing chamber 51 which faces an adjacent one of the cooling units 200 is provided with a shutter 58.

The shutter 59 is opened by an opening/closing mechanism not shown when the transport unit 56 transports the substrate W into the processing chamber 51, and is closed at other times. The shutter 58 is opened by an opening/closing mechanism not shown when the substrate W is transported from the corresponding drying unit 100 to the adjacent cooling unit 200 after the heating process of the substrate W in the corresponding drying unit 100, and is closed at other times.

Referring to FIGS. 8 and 9, the cooling unit 200 principally comprises: a processing chamber 61, a container 205 provided inside the processing chamber 61 for performing the cooling process; a pump 253 for exhausting the atmosphere in the interior 210 (referred to hereinafter as a "container interior 210") of the container 205 to the outside to create a reduced-pressure atmosphere in the container interior 210; and a cooling plate 212 provided inside the container 205 for cooling the substrate W.

The processing chamber 61 has an enclosure structure which closes off communication between the interior and exterior of the processing chamber 61 to prevent the atmosphere in the processing chamber 61 from leaking out to the drying unit 100, the transport passage TP2 and the interface 40. A wall surface of the processing chamber 61 which faces the drying unit 100 is provided with a shutter 68, and a wall surface of the processing chamber 61 which faces the transport passage TP2 is provided with a shutter 69.

The shutter 68 is opened by an opening/closing mechanism not shown when the substrate W is transported from the drying unit 100 to the cooling unit 200 after the heating process of the substrate W in the drying unit 100, and is closed at other times. The shutter 69 is opened by an opening/closing mechanism not shown when the transport unit 56 transports the substrate W out of the processing chamber 61 after the cooling process of the substrate W to be described later in the cooling unit 200, and is closed at other times.

The interior space of the cooling unit 200 and the interior space of the drying unit 100 communicate with each other through an opening 260 by opening the shutter 58 provided in the processing chamber 51 and the shutter 68 provided in the processing chamber 61, as shown in FIG. 10. With both of the shutters 58 and 68 open, a transport unit 66 to be described later can transport the substrate W between the drying unit 100 and the cooling unit 200.

The container 205 is provided inside the processing chamber 61, and performs the cooling process therein. As shown in FIG. 9, the container 205 includes an upper cover 215 and a base part 217. The upper cover 215 is a substantially cylindrical member with an opening in its bottom. The upper cover 215 is connected to an elevating mechanism 216, and is movable up and down, the lowermost position of the upper cover 215 being such a position that the opening is substantially level with the upper surface of the base part 217.

An enclosure mechanism not shown is provided in a portion of contact between the base part 217 and the upper cover 215. This closes off communication between the container interior 210 surrounded by the inner surfaces of the upper cover 215 and the base part 217 and the interior of the processing chamber 61. Therefore, the elevating mechanism 216 moves the upper cover 215 downwardly to the lowermost position so that the enclosure mechanism encloses the container interior 210, and the pump 253 to be described later exhausts the atmosphere in the container interior 210 to the outside to create a reduced-pressure atmosphere in the container interior 210.

The cooling plate 212 is a substantially cylindrical member fixed on the base part 217. A plurality of (specifically at least three) support pins 211 are mounted upright on the upper surface of the cooling plate 212. The plurality of support pins 211 support the substrate W to hold the substrate W stationary. The plurality of support pins 211 are cooperatively moved up and down by an elevating mechanism not shown so that the upper ends of the respective support pins 211 are at substantially the same vertical position. Therefore, the upper cover 215 is moved upwardly, and the support pins 211 are moved upwardly to raise the substrate W to a transfer position, thereby to allow the substrate W to be transferred between the cooling plate 212 and the transport unit 66 to be described later (See FIG. 11).

The support pins 211 are lowered when the cooling plate 212 cools the substrate W. This brings the bottom surface of the substrate W into proximity to or into contact with the upper surface of the cooling plate 212, to allow heat to transfer from the substrate W to the cooling plate 212, thereby cooling the substrate W.

Figure 12:
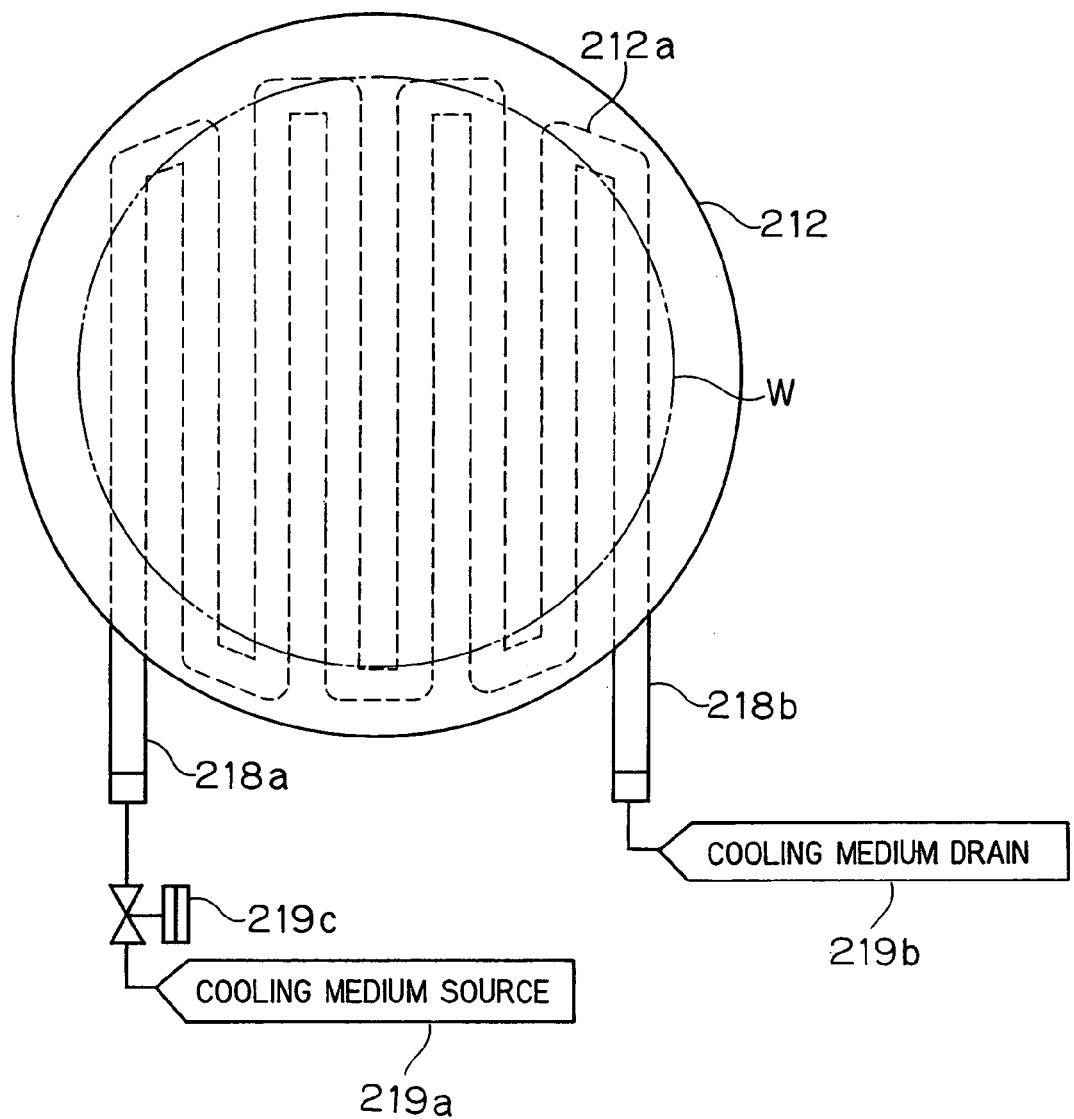
FIG. 12 is a schematic plan view of a cooling plate according to the third preferred embodiment.
Figure 13A:
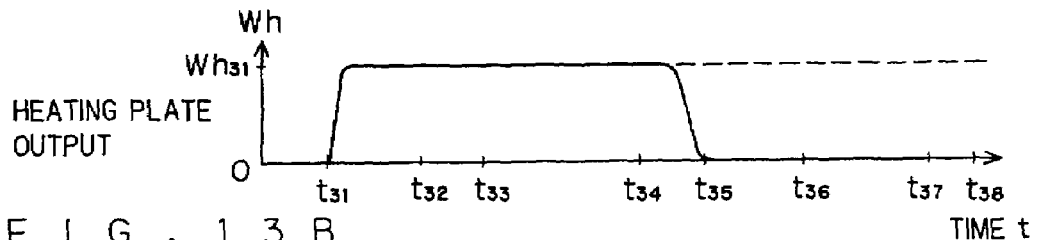
FIGS. 13A, 13B, 13C and 13D show the control timing of the heating plate output, the supply rate of the process gas and the pump output, and the pressure in the container interior according to the third preferred embodiment.
Figure 13B:
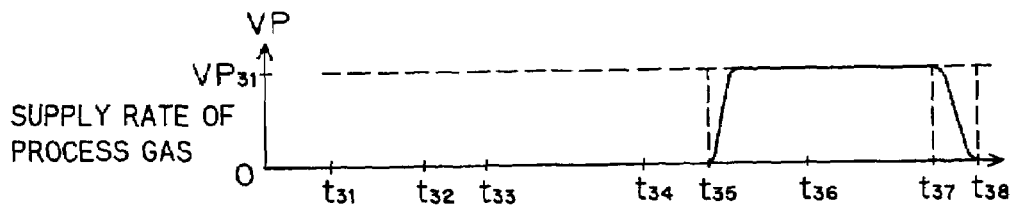
Figure 13C:
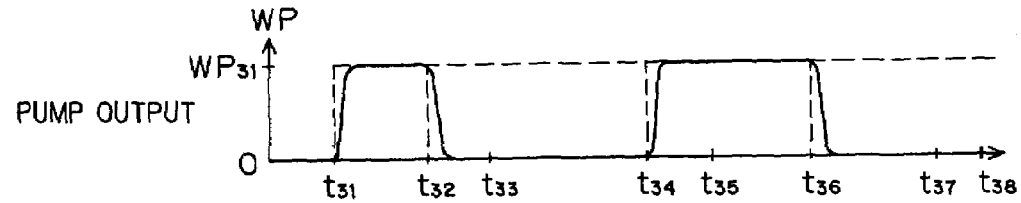
Figure 13D:
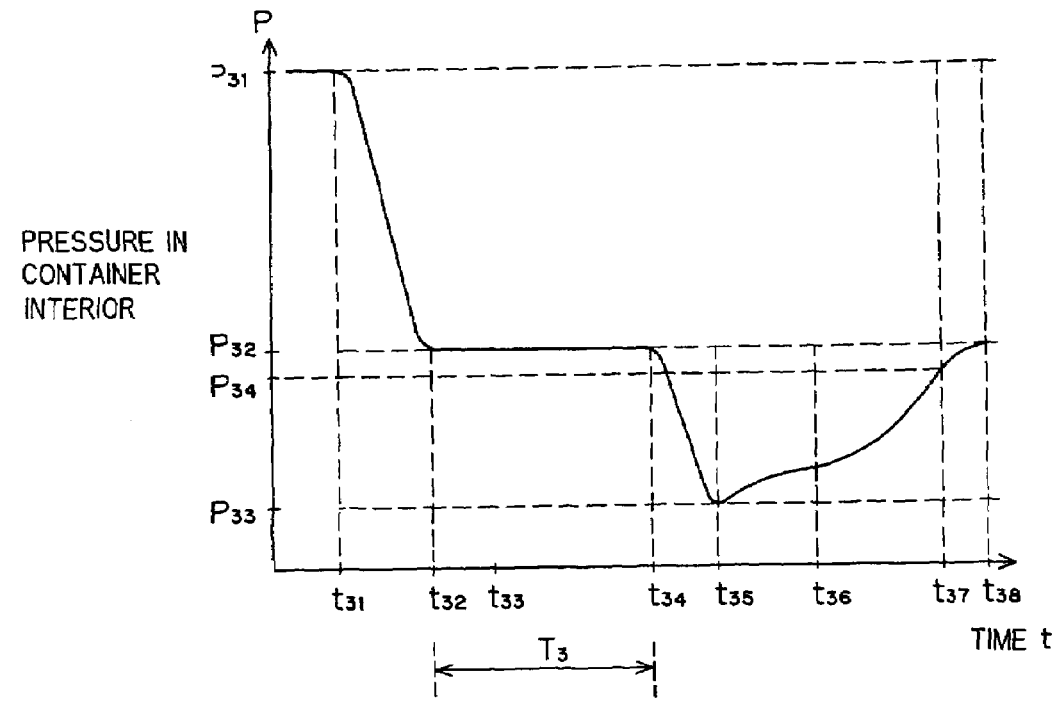
Figure 14A:
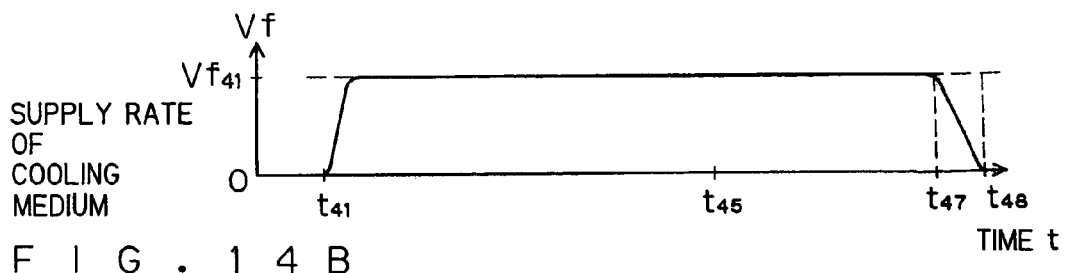
FIGS. 14A, 14B, 14C and 14D show the control timing of the supply rate of a cooling medium, the supply rate of the process gas and the pump output, and the pressure in the container interior according to the third preferred embodiment.
Figure 14B:
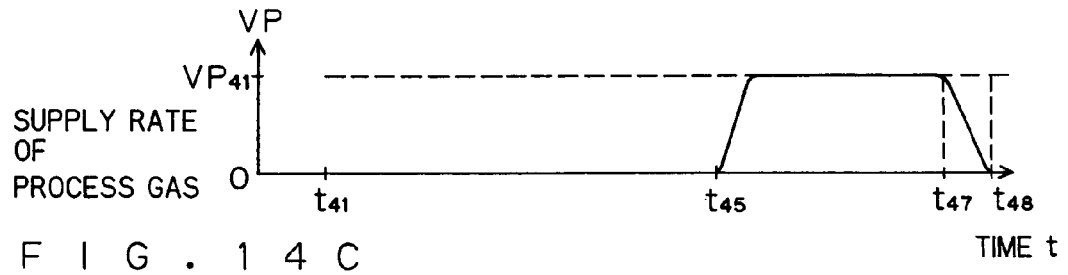
Figure 14C:
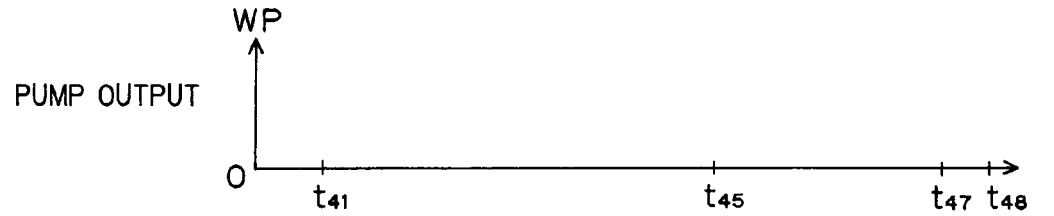
Figure 14D:
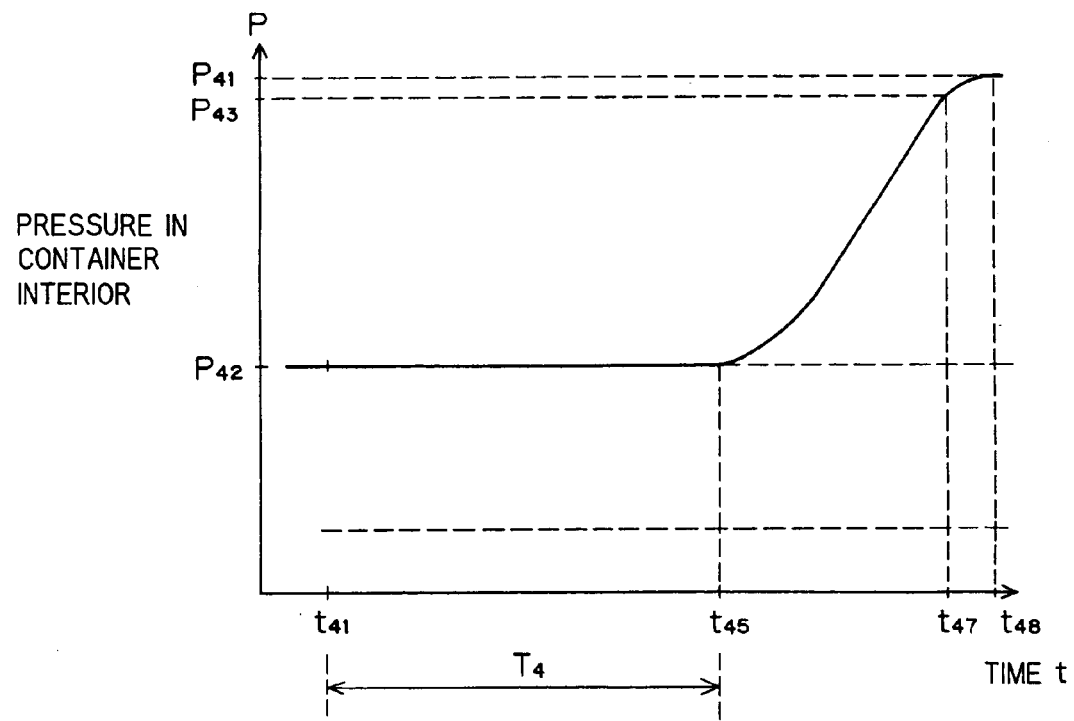

A cooling pipe 212a is provided inside the cooling plate 212. As shown in FIG. 12, the cooling pipe 212a has a meandering configuration in such a manner as to be folded back a plurality of times inside the cooling plate 212 for the purpose of obtaining the greater surface area thereof. The cooling pipe 212a has a first end in communication with a cooling medium source 219a through a pipe 218a and a valve 219c, and a second end in communication with a cooling medium drain 219b through a pipe 218b. A cooling medium is fed into the cooling pipe 212a by opening the valve 219c. This provides a heat exchange between the cooling medium fed into the cooling pipe 212a and the substrate W (or heat transfer from the substrate W to the cooling medium) through the upper surface of the cooling plate 212, thereby to cool the substrate W. The cooling medium used for the heat exchange is drained from the cooling pipe 212a to the cooling medium drain 219b.

Although water is used as the cooling medium in the third preferred embodiment, the cooling medium is not limited to water but may be other fluids having high thermal conductivity. In the structure of FIG. 12, the cooling medium used for the heat exchange in the cooling pipe 212a is drained to the cooling medium drain 219b. However, the present invention is not limited to such a structure. For example, the cooling medium drained from the pipe 218b may be cooled down to a temperature required to cool the substrate W and then be fed into the cooling pipe 212a again for use in the cooling process. The cooling plate 212 has the cooling structure in which the cooling medium is fed into the cooling pipe 212a as mentioned above, but may employ a Peltier device and the like.

A discharge nozzle 231 for discharging the process gas toward the substrate W is provided near the axis of the upper cover 215 having the substantially cylindrical shape and near the inner upper portion of the upper cover 215. As shown in FIG. 9, the discharge nozzle 231 is in communication with a process gas source 237 through a pipe 232 and a valve 235. By opening the valve 235, the process gas is supplied into the container 205 to provide a process gas atmosphere in the container interior 210. Although nitrogen gas is used as the process gas in this preferred embodiment, helium gas or argon gas may be used if the gas is chemically stable (an inert gas).

The base part 217 is provided with two exhaust outlets 251, as shown in FIG. 9. The exhaust outlets 251 are in communication with an exhaust drain 257 through a pipe 252, a pump 253 and a valve 255. Therefore, the container 205 is placed into an enclosed condition, and the pump 253 is operated, with the valve 255 open, to exhaust the atmosphere in the container interior 210 to the outside of the container 205, thereby creating a reduced-pressure atmosphere in the container interior 210.

The transport unit 66 for transporting the substrate W is provided between the shutter 68 in the processing chamber 61 and the container 205, as illustrated in FIGS. 8 and 9. The transport unit 66 is a transport robot for transporting the substrate W between the container 105 of the drying unit 100 and the container 205 of the cooling unit 200.

The transport unit 66 has an arm 67a mounted on top of an arm support 67b and pivotable about an axis J in the directions indicated by the arrow AR4 by a pivot mechanism not shown. The arm 67a is also extendable/retractable in the longitudinal direction of the arm 67a (in the directions indicated by the arrow A3) with respect to the axis J. Thus, the shutters 58 and 68 are open and the arm 67a is pivoted and extended/retracted, whereby the substrate W is transported between the container 105 of the drying unit 100 and the container 205 of the cooling unit 200.

Description will be given on a substrate processing procedure for removing the polymer residue deposited on the substrate W by the use of the substrate processing apparatus 500 according to the third preferred embodiment. The processing of the substrate processing apparatus 500 principally comprises: (1) a removal process step for removing the polymer residue deposited on the substrate W in the removal part 20; (2) a heating process step for heating the substrate W in the drying unit 100 of the drying part 50; and (3) a cooling process step for cooling the substrate W in the cooling unit 200 of the drying part 50.

The removal process step in the removal part 20 has been described in the first preferred embodiment. The heating process step and the cooling process step in the drying part 50 will be described in the third preferred embodiment.

The substrate W subjected to the polymer removal process in the removal part 20 is placed on the transfer table 49 by the transport unit 26. Then, the transport unit 56 takes out the substrate W from the transfer table 49, and loads the substrate W into one of the drying units 100. Specifically, in the selected drying unit 100, the shutter 59 of the processing chamber 51 is opened, and the elevating mechanism 116 moves the upper cover 115 of the container 105 upwardly in the direction of the arrow AR1. The substrate W is transferred from the transport unit 56 to the support pins 111 in their raised position (See FIG. 4). Then, the shutter 59 is closed and the upper cover 115 is moved downwardly to ensure the hermeticity of the container 105. The support pins 111 are moved downwardly to bring the substrate W into proximity to or into contact with the heating plate 112.

After the substrate W is supported in the container 105, the drying process is performed on the substrate W by the heating plate 112 in the container 105, as in the second preferred embodiment.

FIGS. 13A, 13B, 13C and 13D show the control timing of the output from the heating plate, the supply rate of the process gas and the output from the pump, and the pressure in the container interior in the heating process step according to the third preferred embodiment. The horizontal axes of FIGS. 13A to 13D indicate time t. The vertical axis of FIG. 13A indicates the output (power) Wh from the heating plate 112 as a function of time t, and the vertical axis of FIG. 13B indicates the supply rate Vp per unit time of the process gas as a function of time t. The vertical axis of FIG. 13C indicates the output Wp from the pump 153 as a function of time t, and the vertical axis of FIG. 13D indicates the pressure P in the container interior 110 as a function of time t.

At time t31 at which the drying process starts, the pressure P in the container interior 110 has a value P31 approximately equal to atmospheric pressure because the output Wp from the pump 153 equals "zero." The output Wh from the heating plate 112 is set at "zero." The supply rate Vp of the process gas is "zero" because the valve 135 is closed. Prior to the time t31 at which the drying process starts, the pump 153 is driven and the valve 135 is opened to previously replace the atmosphere in the container 105 with a process gas atmosphere.

The output Wp from the pump 153 gradually increases from "zero" toward a value Wp31 at time t31. This causes the atmosphere in the container interior 110 to be exhausted to the exhaust drain 157, to gradually decrease the pressure P in the container interior 110 from the value P31, thereby providing a reduced-pressure atmosphere.

The controller 90 sets the output Wh from the heating plate 112 at a value Wh31 at time t31. This gradually increases the output Wh from the heating plate 112 from "zero" toward the value Wh31 to raise the temperature of the upper surface of the heating plate 112. Heat transfers from the upper surface of the heating plate 112 to the bottom surface of the substrate W to raise the temperature of the substrate W.

The third preferred embodiment handles the drying process, in particular, in the back-end process step, as in the second preferred embodiment. Therefore, the substrate W heated and dried is little affected by water marks, but is dried satisfactorily.

Prior to the time t31 at which the drying process starts, the inert process gas atmosphere is produced in the container 105, and oxygen in the container interior 110 is replaced with the process gas, as in the second preferred embodiment. Thus, a reduced-oxygen atmosphere is created in the container interior 110. This prevents oxidation of metals used for wiring patterns, such as Al and Cu, formed on the substrate W if the temperature of the substrate W is raised.

As in the second preferred embodiment, the temperature of the substrate W during the drying of the substrate W by heating according to the third preferred embodiment is within the range of 150 degrees centigrade higher than the boiling point of deionized water to 300 degrees centigrade lower than the temperature at which the wiring patterns undergo oxidation even in the reduced-oxygen atmosphere (preferably within the range of 240 degrees centigrade to 260 degrees centigrade).

Next, at time t32 at which the pressure P in the container interior 110 reaches a value P32, the output Wp from the pump 153 is set at "zero." The exhaust of the atmosphere in the container interior 110 to the outside of the container 105 is stopped. The pressure in the container interior 110 is held at the constant value P32, and the output Wh from the heating plate 112 is held at the constant value Wh31.

During a time interval between t32 and t34, the process gas is not supplied to the container interior 110, the output Wp from the pump 153 is set at "zero," and the atmosphere in the container interior 110 is not exhausted to the exhaust drain 157, whereby the pressure P in the container interior 110 is held at the constant value P32. Heating of the substrate W continues during the time interval between t32 and t34, to suppress a gas flow directed downwardly inside the container 105.

This prevents the turbulence of the atmosphere near the substrate W, to achieve satisfactory heat transfer from the heating plate 112 to the substrate W, as in the second preferred embodiment. As a result, the efficient heating of the substrate W is achieved to efficiently remove not only water or moisture adhering to the surface of the substrate W but also water or moisture entering a space between lines, the inside of holes and the inside of resist films of the fine patterns formed on the substrate W, thereby drying the substrate W.

The time interval T3 (between t32 and t34) during which the pressure P in the container interior 110 is held at the constant value is determined depending on the material of the substrate W, the pressure in the container interior 110 and the like, and may be previously obtained by experiment and the like.

Next, when the controller 90 sets the output Wp from the pump 153 at the value Wp31 at time t34 which is the time interval T3 later than the time t32, the output Wp from the pump 153 gradually increases from "zero" to reach the constant value Wp31. The pump 153 continues to exhaust the vapor of water contained in the container interior 110 to the exhaust drain 157.

At time t35 at which vaporization of water or moisture from the substrate W is completed, the valve 135 shown in FIG. 9 is opened while the output Wp from the pump 153 is held at the value Wp31. Then, the supply rate Vp per unit time of the process gas to the container interior 110 gradually increases from "zero" to reach a constant value Vp31. Therefore, the vapor of water contained in the atmosphere in the container interior 110 is replaced with the process gas and exhausted to the exhaust drain 157.

Additionally, at time t35 at which the vaporization of water or moisture from the substrate W is completed, the controller 90 sets the output Wh from the heating plate 112 at "zero." Then, the output Wh from the heating plate 112 gradually decreases from the value Wh31 to "zero."

At time t36 at which almost all of the vapor of water in the container interior 110 is exhausted to the exhaust drain 157, the controller 90 sets the output Wp from the pump 153 at "zero". The output Wp from the pump 153 gradually decreases from the value Wp31 to "zero." The pressure in the container interior 110 accordingly increases. Next, at time t37 at which the pressure P in the container interior 110 reaches a value P34, the valve 135 is closed to stop the supply of the process gas. The drying unit 100 completes the drying process at time t38 at which the pressure P in the container interior 110 reaches the value P32.

After the completion of the drying process in the drying unit 100, the transport unit 66 transports the heated substrate W from the drying unit 100 to the cooling unit 200. The transport unit 66 first unloads the substrate W from the processing chamber 51 of the drying unit 100. Specifically, the shutter 58 of the processing chamber 51 and the shutter 68 of the processing chamber 61 are opened so that the interior space of the processing chamber 51 and the interior space of the processing chamber 61 communicate with each other through the opening 260.

Next, the elevating mechanism 116 moves the upper cover 115 of the container 105 upwardly in the direction of the arrow AR1. The support pins 111 are moved upwardly, and the arm 67a of the transport unit 66 is pivoted and expanded/retracted, whereby the substrate W is transferred from the support pins 111 to the arm 67a (See FIG. 10). When the arm 67a is retracted out of the processing chamber 51, the upper cover 115 is moved downwardly and the shutters 58 and 68 are closed.

Subsequently, the transport unit 66 transports the substrate W into the container 205 of the cooling unit 200. Specifically, the elevating mechanism 216 moves the upper cover 215 of the container 205 upwardly in the direction of the arrow AR2. The support pins 211 are moved upwardly, and the arm 67a of the transport unit 66 is pivoted and expanded/retracted, whereby the substrate W is transferred from the arm 67a to the cooling plate 212 (See FIG. 11). When the arm 67a is retracted from under the upper cover 215, the upper cover 215 is moved downwardly, and the enclosure mechanism (not shown) provided in a portion of contact between the upper cover 215 and the base part 217 encloses the container 205.

Thereafter, the support pins 211 are moved downwardly to bring the bottom surface of the substrate W into contact with or into proximity to (in this preferred embodiment, into contact with) the upper surface of the cooling plate 212. Then, the cooling process step on the substrate W starts. FIGS. 14A, 14B, 14C and 14D show the control timing of the supply rate of the cooling medium from the cooling medium source 219a (See FIG. 12), the supply rate of the process gas from the process gas source 237 (See FIG. 9) and the output from the pump, and the pressure in the container interior 210. The horizontal axes of FIGS. 14A to 14D indicate time t. The vertical axis of FIG. 14A indicates the supply rate Vf per unit time of the cooling medium as a function of time t, and the vertical axis of FIG. 14B indicates the supply rate Vp per unit time of the process gas as a function of time t. The vertical axis of FIG. 14C indicates the output Wp from the pump 253 as a function of time t, and the vertical axis of FIG. 14D indicates the pressure P in the container interior 210 as a function of time t.

Prior to time t41 at which the cooling process starts, the process gas from the process gas source 237 is supplied to the container interior 210, and the pump 253 exhausts the atmosphere in the container interior 210 to the exhaust drain 257. Thus, oxygen in the container 205 is replaced with the process gas, and a reduced-pressure atmosphere filled with the process gas (i.e., a reduced-pressure reduced-oxygen atmosphere) is produced in the container 205. Prior to the time t41, the valve 219c is closed. Thus, the cooling medium has not yet been fed into the cooling pipe 212a of the cooling plate 212.

At time t41, the valve 219c is opened to gradually increase the supply rate Vf per unit time of the cooling medium from the cooling medium source 219a to the cooling pipe 212a from "zero" toward a value Vf41. Heat transfers from the substrate W through the upper surface of the cooling plate 212 to the cooling medium fed to the cooling pipe 212a, whereby the substrate W is cooled. During a time interval between t41 and t45, the output Wp from the pump 253 is "zero," and the supply rate Vp per unit time of the process gas from the process gas source 237 to the container interior 210 is "zero." Thus, the atmosphere in the container interior 210 is not exhausted to the outside of the container 205, and the pressure P in the container interior 210 is held at a constant value P42.

This suppresses a gas flow directed downwardly inside the container 205, to prevent the turbulence of the atmosphere near the substrate W, thereby achieving satisfactory heat transfer from the substrate W to the cooling plate 212. The result is efficient cooling of the substrate W.

The time interval T4 (between t41 and t45) during which the substrate W is cooled while the pressure P in the container interior 210 is held at the constant value P42 is determined depending on the material of the substrate W, the pressure in the container interior 210 and the like, and may be previously obtained by experiment and the like.

Because the heated substrate W is cooled in the reduced-pressure reduced-oxygen atmosphere as described above, the third preferred embodiment prevents oxidation of metals used for wiring patterns, such as Al and Cu, formed on the substrate W if the temperature of the substrate W is high.

Next, the valve 235 is opened at time t45 which is the time interval T4 later than the time t41. The supply rate Vp per unit time of the process gas to the container interior 210 gradually increases from "zero" to reach a constant value Vp41. The process gas is supplied to the container interior 210, and the pressure in the container interior 210 accordingly increases rapidly.

Next, at time t47 at which the pressure P in the container interior 210 reaches a value P43, the valve 235 is closed to stop the supply of the process gas to the container interior 210, and the valve 219c is closed to stop the feed of the cooling medium to the cooling pipe 212a. The cooling process is completed at time t48 at which the pressure P in the container interior 210 reaches a value P41 approximately equal to atmospheric pressure.

Since the completion of the cooling process in the cooling unit 200 is the completion of the substrate processing, the processed substrate W is transported toward the unloading part 13. More specifically, the elevating mechanism 216 moves the upper cover 215 upwardly in the direction of the arrow AR2. The substrate W is moved upwardly by moving up the support pins 211 mounted upright on the cooling plate 212, and the shutter 69 is opened.

Next, the transport unit 56 unloads the substrate W held by the support pins 211 from the cooling unit 200. Subsequently, the transfer table 49, the transport unit 26, the transfer table 19 and the loading/unloading mechanism 17 are used to load the processed substrate W unloaded from the cooling unit 200 into a carrier C placed on the unloading part 13, as in the first preferred embodiment. The transport mechanism not shown transports the carrier C containing the substrate W subjected to the substrate processing to the outside of the substrate processing apparatus 500.

In the third preferred embodiment, the substrate W is dried by heating in the drying unit 100 with the reduced-pressure reduced-oxygen atmosphere provided in the container interior 110, and the substrate W heated in the drying unit 100 is cooled in the cooling unit 200 with the reduced-pressure reduced-oxygen atmosphere provided in the container interior 210. Therefore, the third preferred embodiment prevents oxidation of metals used for wiring patterns, such as Al and Cu, formed on the substrate W during the heating and cooling of the substrate W.

4. Fourth Preferred Embodiment

The substrate processing apparatus according to a fourth preferred embodiment of the present invention will be described. The substrate processing apparatus of the fourth preferred embodiment is similar in hardware construction to the substrate processing apparatus 1 of the first preferred embodiment except that the transport unit 56 included in the drying part 50 has a cooling structure to be described later. The difference will be principally described in the fourth preferred embodiment.

Like reference numerals and characters are used in the following description to designate components similar to those of the substrate processing apparatus 1 of the first preferred embodiment. Since these components designated by the like reference numerals and characters have been described in the first preferred embodiment, description about these components will be omitted in the fourth preferred embodiment.

Figure 15:
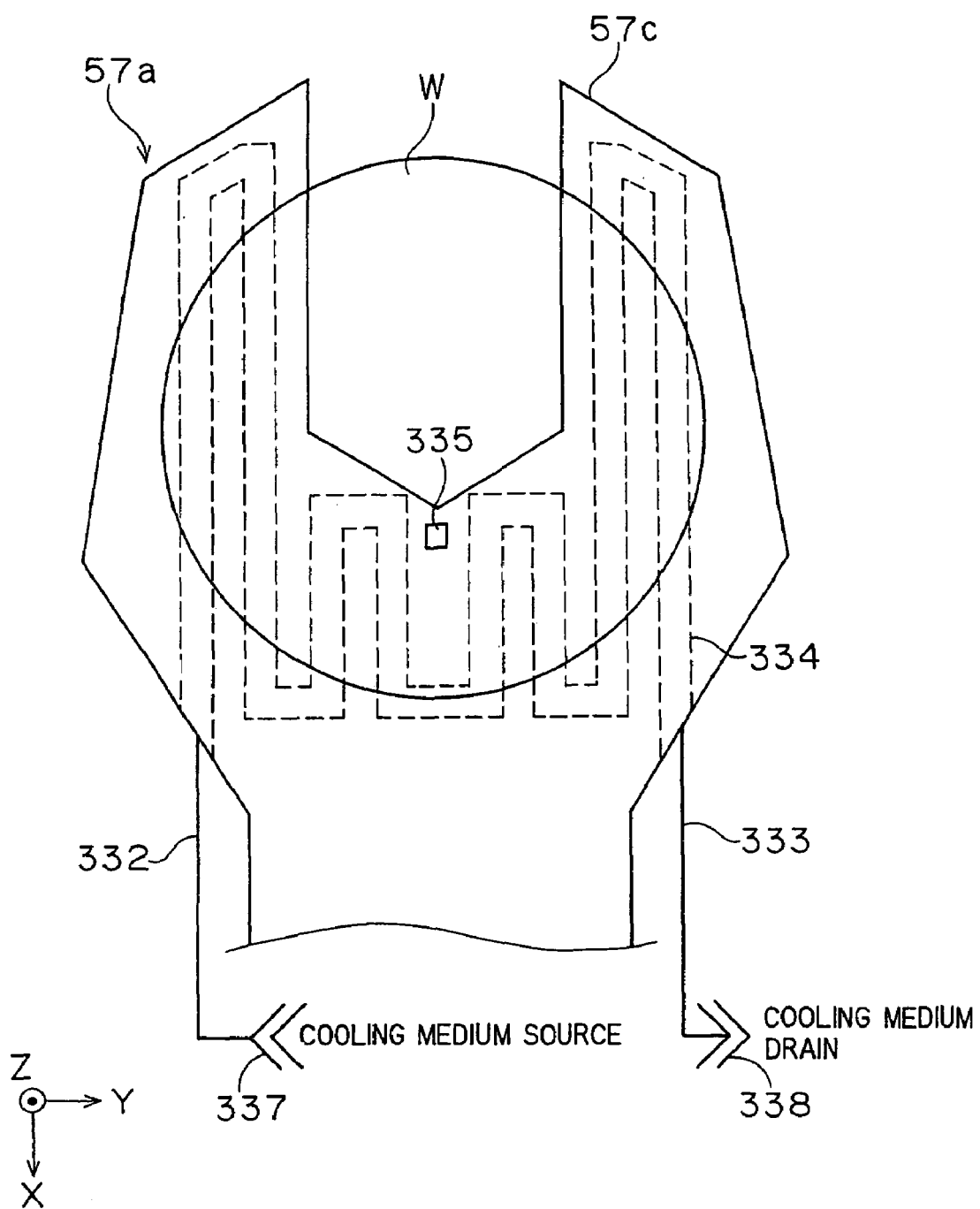
FIG. 15 is a schematic top view of an arm of a transport unit according to a fourth preferred embodiment of the present invention.

FIG. 15 is a schematic top view of a distal end portion 57c of the arm 57a of the transport unit 56 according to the fourth preferred embodiment. As discussed in the first preferred embodiment, the arm 57a is extendable/retractable in the longitudinal direction of the arm 57a and pivotable about a pivot axis substantially parallel to the Z axis. Thus, the transport unit 56 pivots and extends/retracts the arm 57a to place the substrate W thereon, with the substrate W in contact with the upper surface of the distal end portion 57c of the arm 57a, thereby transferring and receiving the substrate W to and from each of the four drying units 100 and to and from the transfer table 49. For placement of the substrate W on the distal end portion 57c of the arm 57a, a suction mechanism not shown may be used to vacuum-hold the substrate W on the distal end portion 57c of the arm 57a.

The fourth preferred embodiment employs a cooling structure for cooling the substrate W using a cooling medium in the distal end portion 57c. A cooling pipe 334 is provided inside the distal end portion 57c of the arm 57a, as illustrated in FIG. 15. The cooling pipe 334 has a meandering configuration in such a manner as to be folded back a plurality of times inside the distal end portion 57c of the arm 57a for the purpose of obtaining the greater surface area thereof. The cooling pipe 334 has a first end in communication with a cooling medium source 337 through a pipe 332, and a second end in communication with a cooling medium drain 338 through a pipe 333. A cooling medium is fed into the cooling pipe 334 to efficiently cool the substrate W placed on the upper surface of the distal end portion 57c of the arm 57a.

This provides a heat exchange between the cooling medium fed into the meandering cooling pipe 334 and the substrate W (or heat transfer from the substrate W to the cooling medium) through the upper surface of the distal end portion 57c of the arm 57a. The cooling medium warmed after the use for the heat exchange is drained from the cooling pipe 334 to the cooling medium drain 338. This allows the use of the unwarmed cooling medium for the cooling of the substrate W to achieve efficient cooling of the substrate W.

Although water is used as the cooling medium in the fourth preferred embodiment, the cooling medium is not limited to water but may be other fluids suitable for heat exchange. In the structure of the fourth preferred embodiment, the cooling medium is always fed to the cooling pipe 334 provided inside the distal end portion 57c of the arm 57a independently of whether or not the substrate W is placed on the upper surface of the distal end portion 57c. However, the present invention is not limited to such a structure. The cooling medium may be fed to the cooling pipe 334 when a contact or non-contact sensor senses the substrate W placed on the distal end portion 57c of the arm 57a.

Further, the cooling medium used for the heat exchange in the cooling pipe 334 is drained to the cooling medium drain 338 and discarded in the structure shown in FIG. 15. However, the present invention is not limited to such a structure. For example, the cooling medium drained from the pipe 333 may be cooled down to a temperature required to cool the substrate W and then be fed into the cooling pipe 334 again for use in the cooling process. Moreover, the distal end portion 57c of the arm 57a has the cooling structure in which the cooling medium is fed into the cooling pipe 334 as mentioned above, but may employ an electronic cooling device such as a Peltier device.

As illustrated in FIG. 15, the distal end portion 57c of the arm 57a is provided with a contact thermometer 335 (e.g., a thermometer including a resistance thermometer sensor or resistance temperature detector, and the like) positioned to contact a near-center portion of the bottom surface of the substrate W. This achieves precise monitoring of the temperature of the substrate W.

Description will be given on a substrate processing procedure for removing the polymer residue deposited on the substrate W by the use of the substrate processing apparatus according to the fourth preferred embodiment. The substrate processing of the fourth preferred embodiment principally comprises: (1) a removal process step for removing the polymer residue deposited on the substrate W in the removal part 20; (2) a heating process step for heating the substrate W in the drying unit 100 of the drying part 50; and (3) a cooling process step for cooling the substrate W by placing the substrate W on the transport unit 56 of the drying part 50.

The removal process step in the removal part 20 has been described in the first preferred embodiment, and the heating process step in the drying unit 100 of the drying part 50 has been described in the second preferred embodiment. The cooling process step for cooling the substrate W by the transport unit 56 of the drying part 50 will be described in the fourth preferred embodiment.

After the completion of the drying process in the drying unit 100, the heated substrate W is cooled by the cooling structure of the transport unit 56. In the cooling process step, the process gas is initially discharged from the discharge nozzle 141 toward the substrate W. Then, the support pins 111 mounted upright on the heating plate 112 are moved upwardly to raise the substrate W to the transfer position. The elevating mechanism 116 moves the upper cover 115 upwardly in the direction of the arrow AR1, and the shutter 59 is opened. This maintains the process gas atmosphere near the substrate W to provide the reduced-oxygen atmosphere near the substrate W if the upper cover 115 is moved up.

Next, the arm 57a is extended to move the distal end portion 57c of the arm 57a to over the heating plate 112. The substrate W supported by the support pins 111 is placed on the upper surface of the distal end portion 57c of the arm 57a to which the cooling medium is continuously fed. This causes heat transfer from the substrate W raised in temperature by heating to the cooling medium in the cooling pipe 334 to lower the temperature of the substrate W rapidly. In this process, the process gas is continuously discharged toward the substrate W.

As discussed above, the fourth preferred embodiment provides the reduced-oxygen atmosphere near the substrate W when the cooling structure provided in the arm 57a cools the substrate W. This prevents oxidation of metals used for wiring patterns, such as Al and Cu, formed on the substrate W during the cooling. Additionally, the transport unit 56 according to the fourth preferred embodiment is capable of cooling the substrate W while unloading the substrate W from the drying unit 100. In other words, the transport unit 56 is capable of the operation of unloading the substrate W and the cooling process step at the same time. Therefore, the cycle time of the entire substrate processing is reduced.

Next, when the thermometer 335 detects that the substrate W is at a predetermined temperature, the cooled substrate W is transferred from the transport unit 56 to the transfer table 49, and the cooling process is terminated. In the fourth preferred embodiment, the cooling process is based on the temperature of the substrate W measured by the thermometer 335. The present invention, however, is not limited to this. For example, the substrate W may be cooled by leaving the substrate W to stand on the distal end portion 57c of the arm 57a for a fixed length of time. The length of time for which the substrate W is cooled is determined depending on the size of the substrate W, the material of the fine patterns formed on the substrate W and the like, and may be previously obtained by experiment and the like.

As in the first preferred embodiment, the transfer table 49, the transport unit 26, the transfer table 19 and the loading/unloading mechanism 17 are used to load the processed substrate W into a carrier C placed on the unloading part 13. The transport mechanism not shown transports the carrier C containing the substrate W subjected to the substrate processing to the outside of the substrate processing apparatus.

In the fourth preferred embodiment, the substrate W is dried by heating in the drying unit 100 with the reduced-pressure reduced-oxygen atmosphere provided in the container interior 110, and the substrate W is cooled by the cooling structure provided in the transport unit 56 while the substrate W is unloaded from the drying unit 100. This reduces the cycle time of the substrate processing.

Additionally, the substrate W is cooled in the reduced-oxygen atmosphere in the fourth preferred embodiment. Therefore, the fourth preferred embodiment prevents oxidation of metals used for wiring patterns, such as Al and Cu, formed on the substrate W during the cooling of the substrate W.

5. Modifications

While the preferred embodiments according to the present invention have been described above, the present invention is not limited to the above-mentioned examples.

(1) The procedure of drying the substrate W described in the first to fourth preferred embodiments employs one of the drying process (A) of discharging the vapor of organic solvent toward the substrate W in the reduced-pressure atmosphere to dry the substrate W, and the drying process (B) of heating the substrate in the reduced-pressure atmosphere to dry the substrate W. However, the present invention is not limited to this. For example, the drying process (A) using the vapor of organic solvent may be performed after the drying process (B) by heating, or the drying process (B) may be performed after the drying process (A).

(2) In the first to fourth preferred embodiments, the discharge nozzles 131 and 231 for discharging the process gas are provided in the inner upper portions of the containers 105 and 205, respectively, but are not limited to such an arrangement. For example, the discharge nozzles 131 and 231 may be provided at the lower portion of the upper covers 115 and 215, respectively, so that the process gas is supplied to near the upper surface of the substrate W.

(3) The removal units 30 and the drying units 100 in the first, second and fourth preferred embodiments are arranged in two dimensions, but are not limited to such an arrangement. The removal units 30 and the drying units 100 may be arranged in vertically stacked relation (along the Z axis). The removal units 30 and the unit pairs each comprised of one drying unit 100 and one cooling unit 200 in the third preferred embodiment may also be arranged in vertically stacked relation. This reduces the floor area of the substrate processing apparatus.

(4) In the second and third preferred embodiments, the substrate W is cooled for a length of time previously determined by experiment and the like. Subsequently, the process gas is supplied into the containers 105 and 205 so that the internal container pressure is approximately equal to atmospheric pressure. However, the present invention is not limited to this. A contact thermometer or a non-contact thermometer may be used to measure the temperature of the substrate W so that the time to supply the process gas is determined based on the temperature.

(5) In the first preferred embodiment, the vapor of organic solvent is discharged from the discharge nozzle 141 toward the substrate W to replace the water or moisture adhering to the substrate W with the vapor of organic solvent, thereby drying the substrate W. However, the present invention is not limited to such a method. A spray of organic solvent in a liquid state may be discharged, in place of the vapor of organic solvent, to the substrate W.

(6) In the second preferred embodiment, the cooling gas from the cooling gas source 167 and the process gas from the process gas source 137 are supplied through the common discharge nozzle 131 into the container 105. However, the present invention is not limited to this. For example, an additional discharge nozzle may be provided besides the discharge nozzles 131 and 141 so that the discharge nozzle 131 discharges the cooling gas and the additional discharge nozzle discharges the process gas.

(7) In the third preferred embodiment, the diffusion plate 120 described in the first preferred embodiment may be provided between the discharge nozzle 231 provided in the container 205 and the substrate W supported on the cooling plate 212. This allows the diffusion of the process gas discharged from the discharge nozzle 231 to efficiently create the process gas atmosphere in the container interior 210.

(8) The drying part 50 according to the third preferred embodiment comprises the two drying units 100 and the two cooling units 200. However, the number of drying units 100 and the number of cooling units 200 are not limited to two but are required only to be equal to each other.

(9) The cooling structure according to the third preferred embodiment adopts the method in which the cooling medium is fed into the cooling pipe 212a when the cooling process step is executed, and is not fed when the cooling process step is not executed. However, the present invention is not limited to this. For example, if a cooling structure which does not discard but reuses the cooling medium is employed, a different cooling method may be adopted in which the cooling medium is always fed without the control of the feed timing of the cooling medium to the cooling pipe 212a using the valve 219c as in the third preferred embodiment. Such a construction reduces processing loads on the controller 90.

(10) In the fourth preferred embodiment, the cooling medium is always fed to the cooling pipe 334 provided inside the distal end portion 57c of the arm 57a. However, the present invention is not limited to this. The cooling medium may be fed to the cooling pipe 334 when a contact or non-contact sensor senses the substrate W placed on the distal end portion 57c of the arm 57a.

(11) The fourth preferred embodiment uses the contact thermometer to measure the temperature of the substrate W placed on the distal end portion 57c of the arm 57a. However, the present invention is not limited to this, but a non-contact thermometer (e.g., a radiation thermometer) may be used.

While the invention has been described in detail, the foregoing description is in all aspects illustrative and not restrictive. It is understood that numerous other modifications and variations can be devised without departing from the scope of the invention.

What is claimed is:

1. A substrate processing apparatus for drying a substrate after a rinsing solution adhering to a surface of the substrate is spun off by rotating the substrate, said substrate processing apparatus comprising:

a first container for receiving a substrate;

a first holding element provided in said first container for holding said substrate in a gaseous atmosphere;

a heating element provided in said first container for heating said substrate held by said first holding element;

a first process gas discharge element for discharging a process gas into said first container;

a first pressure reduction element for reducing pressure in said first container;

a cleaning unit for discharging a polymer removal solution to remove a polymer deposited on said substrate, followed by supplying a rinsing solution to said substrate to rinse said substrate, and thereafter rotating said substrate to spin off said rinsing solutions; and a transport element for transporting said substrate between said cleaning unit and said first container, said transport element comprising an arm including a cooling mechanism, wherein said heating element heats said substrate in said first container in which a reduced-oxygen atmosphere is created by discharging said process gas from said first process gas discharge element, and said transport element moves said arm to near said first holding element, to thereby cool said substrate heated by said heating element.

* * * * *